United States Patent
Xu et al.

(10) Patent No.: US 12,141,509 B2
(45) Date of Patent: Nov. 12, 2024

(54) HYDRAULIC FRACTURING SYSTEM

(71) Applicant: Schlumberger Technology Corporation, Sugar Land, TX (US)

(72) Inventors: Rong Xu, Abingdon (GB); Sonny Wisaksono, Abingdon (GB)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

(21) Appl. No.: 18/694,883

(22) PCT Filed: Jun. 14, 2023

(86) PCT No.: PCT/US2023/068424
§ 371 (c)(1),
(2) Date: Mar. 22, 2024

(87) PCT Pub. No.: WO2023/245051
PCT Pub. Date: Dec. 21, 2023

(65) Prior Publication Data
US 2024/0265179 A1  Aug. 8, 2024

Related U.S. Application Data

(60) Provisional application No. 63/352,011, filed on Jun. 14, 2022.

(51) Int. Cl.
*G06F 30/28* (2020.01)
(52) U.S. Cl.
CPC .................... *G06F 30/28* (2020.01)
(58) Field of Classification Search
CPC .................. G06F 30/28; G06F 30/20
See application file for complete search history.

(56) References Cited

U.S. PATENT DOCUMENTS

| | | | | |
|---|---|---|---|---|
| 7,634,395 B2 * | 12/2009 | Flandrin | .................. | G06T 17/20 |
| | | | | 703/2 |
| 2013/0096889 A1 * | 4/2013 | Khvoenkova | .......... | G01V 20/00 |
| | | | | 703/2 |

(Continued)

FOREIGN PATENT DOCUMENTS

WO  2022120380 A1  6/2022

OTHER PUBLICATIONS

Ju et al. "Stress shadow effects and microseismic events during hydrofracturing of multiple vertical wells in tight reservoirs: A three-dimensional numerical model" Journal of Natural Gas Science and Engineering 84 (2020) [retrieved on Jul. 11, 2024] (Year: 2020).*

(Continued)

*Primary Examiner* — Juan C Ochoa
*Assistant Examiner* — Alfred H B Wechselberger
(74) *Attorney, Agent, or Firm* — Jeffrey D. Frantz

(57) ABSTRACT

A method can include receiving a stimulated rock volume dimension for a hydraulic fracture in a reservoir where the stimulated rock volume dimension defines a stimulated rock volume region: refining a grid cell model of the reservoir based on the stimulated rock volume dimension by selecting a refinement technique from a group of refinement techniques and generating new finer grid cells in the grid cell model based on the selected refinement technique: assigning a physical property value to each of the new finer grid cells using one or more physical property values selected from a group of existing physical property values; and performing a fluid flow simulation using the grid cell model with the new finer grid cells and their assigned physical property values, and the group of existing physical property values to generate fluid flow simulation results.

17 Claims, 14 Drawing Sheets

(56) References Cited

U.S. PATENT DOCUMENTS

| | | | |
|---|---|---|---|
| 2015/0198737 A1* | 7/2015 | Nguyen | G01V 20/00 |
| | | | 703/6 |
| 2015/0377005 A1* | 12/2015 | Garcia-Teijeiro | G01V 11/00 |
| | | | 703/10 |
| 2017/0051598 A1 | 2/2017 | Ouenes | |
| 2017/0247995 A1 | 8/2017 | Crews et al. | |
| 2018/0364381 A1 | 12/2018 | Raterman et al. | |
| 2021/0140313 A1* | 5/2021 | Busetti | G01V 20/00 |

OTHER PUBLICATIONS

Fung et al. "Unconstrained Voronoi Grids for Densely Spaced Complex Wells in Full-Field Reservoir Simulation" Oct. 2014 SPE Journal, pp. 803-815 [retrieved on Jul. 11, 2024] (Year: 2014).*
Chen et al. "A Review of Hydraulic Fracturing Simulation" Archives of Computational Methods in Engineering (2022) vol. 29, pp. 2113-2170 [retrieved on Jul. 12, 2024] (Year: 2021).*
Sen et al. "Probabilistic Modeling of Hydraulic Fracturing Induced Microseismicity in Shale Plays: An Integrated Approach Using a Coupled Flow and Geomechanical Model" ARMA 14-7547, 48th US Rock Mechanics / Geomechanics Symposium held in Minneapolis, MN, USA [retrieved on Jul. 12, 2024] (Year: 2014).*
PCT International Search Report and Written Opinion; Application No. PCT/US2023/068424; Dated Sep. 29, 2023; 7 pages.
Barati et al.; "A Review of Fracturing Fluid Systems Used for Hydraulic Fracturing of Oil and Gas Wells"; Journal of Applied Polymer Science (2014); 11 pages.

* cited by examiner

HYDRAULIC FRACTURING SYSTEM

RELATED APPLICATION

This application claims priority to and the benefit of a U.S. Provisional Application having Ser. No. 63/352,011, filed 14 Jun. 2022, which is incorporated herein in its entirety.

BACKGROUND

A field operation can include fracturing of a formation, which can be, for example, a reservoir. As an example, a fracturing operation may be referred to as a fracturing job. Hydraulic fracturing (e.g., a stimulation treatment) may be performed on oil and gas wells in low-permeability reservoirs. For example, engineered fluids (e.g., including chemicals such as surfactants, polymers, polymeric surfactants, etc.) can be pumped at high pressure and rate into a reservoir interval to be treated where fracture generation and/or reopening occurs. As an example, wings of a fracture can extend away from a wellbore in opposing directions, for example, according to the natural stresses within the formation. An operation can utilize proppant, such as grains of sand of a particular size, mixed with treatment fluid to keep the fracture open when the treatment is complete. Hydraulic fracturing can aim to create high-conductivity communication with a large area of formation.

As a hydraulic fracture is an underground structure that cannot be visually seen from the surface, uncertainties can exist in the shape, size and location of a hydraulic fracture. Various workflows can include sensing such as, for example, microseismic sensing during hydraulic fracturing, to determine one or more aspects of a hydraulic fracture. Such workflows tend to depend on models such that acquired sensor-based data can be related to spatial characteristics of a hydraulic fracture. A workflow can include generating a model of a reservoir that includes one or more hydraulic fractures where the model is suitable for use in a computational simulator. In particular, such a workflow can include modifying an existing model of a reservoir to include a hydraulic fracture as a new subsurface structure. In such an approach, simulation results from a computational simulator and/or sensor-based data may provide feedback as to how appropriately the hydraulic fracture is represented, which may, for example, inform field operations. Such a workflow can be improved (e.g., as to time and/or accuracy), through use of techniques that can more appropriately represent regions associated with one or more hydraulic fractures in a model.

SUMMARY

A method can include receiving a stimulated rock volume dimension for a hydraulic fracture in a reservoir where the stimulated rock volume dimension defines a stimulated rock volume region; refining a grid cell model of the reservoir based on the stimulated rock volume dimension by selecting a refinement technique from a group of refinement techniques and generating new finer grid cells in the grid cell model based on the selected refinement technique; assigning a physical property value to each of the new finer grid cells using one or more physical property values selected from a group of existing physical property values; and performing a fluid flow simulation using the grid cell model with the new finer grid cells and their assigned physical property values, and the group of existing physical property values to generate fluid flow simulation results.

A system can include a processor; a memory accessible to the processor; processor-executable instructions stored in the memory and executable to instruct the system to: receive a stimulated rock volume dimension for a hydraulic fracture in a reservoir wherein the stimulated rock volume dimension defines a stimulated rock volume region; refine a grid cell model of the reservoir based on the stimulated rock volume dimension by selection of a refinement technique from a group of refinement techniques and generation of new finer grid cells in the grid cell model based on the selected refinement technique; assign a physical property value to each of the new finer grid cells using one or more physical property values selected from a group of existing physical property values; and perform a fluid flow simulation using the grid cell model with the new finer grid cells and their assigned physical property values, and the group of existing physical property values to generate fluid flow simulation results.

One or more non-transitory computer-readable storage media can include computer-executable instructions executable to instruct a computing system to: receive a stimulated rock volume dimension for a hydraulic fracture in a reservoir wherein the stimulated rock volume dimension defines a stimulated rock volume region; refine a grid cell model of the reservoir based on the stimulated rock volume dimension by selection of a refinement technique from a group of refinement techniques and generation of new finer grid cells in the grid cell model based on the selected refinement technique; assign a physical property value to each of the new finer grid cells using one or more physical property values selected from a group of existing physical property values; and perform a fluid flow simulation using the grid cell model with the new finer grid cells and their assigned physical property values, and the group of existing physical property values to generate fluid flow simulation results.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

DETAILED DESCRIPTION

Figure 1:
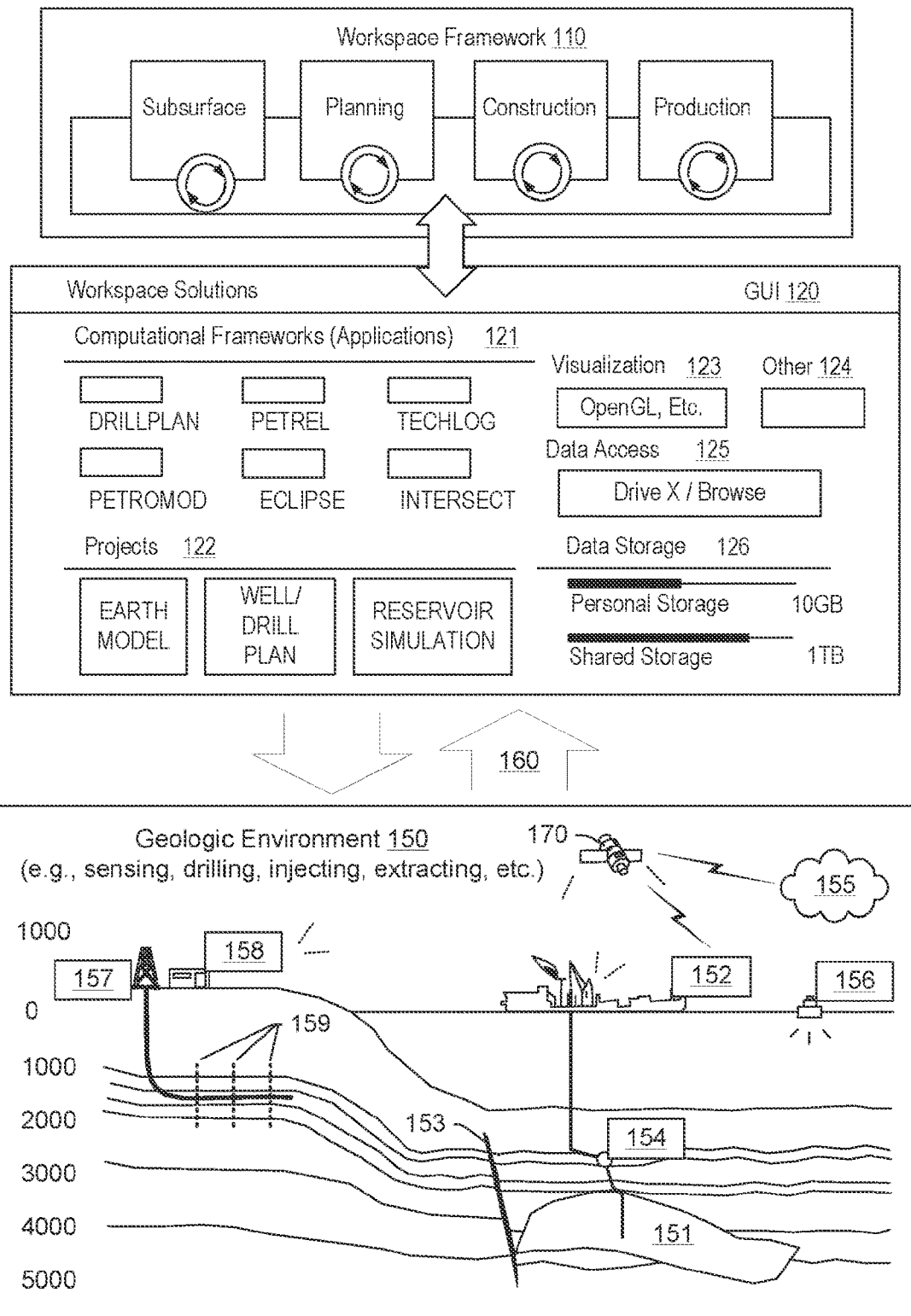
FIG. 1 illustrates an example of a geologic environment and an example of a system.

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

As explained, a workflow can be improved (e.g., as to time and/or accuracy), through use of one or more techniques that can more appropriately represent regions associated with one or more hydraulic fractures in a model. As an example, a method can include refining coarse grid cells of a model in a stimulated rock volume region. To provide context for a stimulated rock volume region, benefits and workflows associated with hydraulic fracturing are described, noting that a method can include improving one or more of such workflows, for example, as to planning, control, production, processing, etc.

Various field operations can include controllable equipment. For example, a controller can be operatively coupled to one or more pieces of equipment to control one or more actions thereof. As an example, a controller can provide for control of pumping equipment and, for example, measurement equipment, which can include one or more sensors.

As to pumping fluid, consider, as an example, hydraulic fracturing operations that can include pumping fluid into a borehole in a formation to generate fractures in the formation. Such pumping can utilize a pump driven by an internal combustion engine where a drive shaft of the internal combustion engine can be operatively coupled to a transmission, which can include various gears that can gear-up or gear-down rotational speed of the drive shaft of the internal combustion engine in a manner that aims to effectively control a pump shaft to achieve one or more desirable pumping parameters (e.g., pump pressure, pump flow rate, etc.). While a single pump is mentioned, a field operation can involve a fleet of pumps where each pump may be mounted on a trailer along with an internal combustion engine and a transmission. A fleet operation can pump fluid to a manifold or manifolds, mixing equipment, etc. A fleet can include homogenous equipment or heterogeneous equipment. For example, a fleet can include a plurality of trailers that include equipment with common specifications or with at least some differing specifications. Further, even where equipment has common specifications, there can be differences in history and/or manufactured specifications from unit to unit, system to system, etc. In some instances, each pump system in a fleet may differ and possess its own characteristics, peculiarities, behaviors, etc. Such a fleet can make unified control problematic, which can result in suboptimal pumping, suboptimal hydraulic fracture generation, suboptimal equipment usage, etc.

As explained, hydraulic fracturing can be improved through use of one or more models and model generation and model refinement. A model-based approach can involve executing a computational simulator using a grid cell model that represents a region that includes one or more hydraulic fractures to generate simulation results. Such simulation results can be informative alone or in combination with sensor data as to various aspects of hydraulic fracturing, well completions, hydrocarbon production, etc.

FIG. 1 shows an example of a system 100 that includes a workspace framework 110 that can provide for instantiation of, rendering of, interactions with, etc., a graphical user interface (GUI) 120. In the example of FIG. 1, the GUI 120 can include graphical controls for computational frameworks (e.g., applications) 121, projects 122, visualization 123, one or more other features 124, data access 125, and data storage 126.

In the example of FIG. 1, the workspace framework 110 may be tailored to a particular geologic environment such as an example geologic environment 150. For example, the geologic environment 150 may include layers (e.g., stratification) that include a reservoir 151 and that may be intersected by a fault 153. As an example, the geologic environment 150 may be outfitted with a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a wellsite and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite 170 in communication with the network 155 that may be configured for communications, noting that the satellite may additionally or alternatively include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

In the example of FIG. 1, the GUI 120 shows some examples of computational frameworks, including the DRILLPLAN, PETREL, TECHLOG, PETROMOD, ECLIPSE, and INTERSECT frameworks (SLB, Houston, Texas).

The DRILLPLAN framework provides for digital well construction planning and includes features for automation of repetitive tasks and validation workflows, enabling improved quality drilling programs (e.g., digital drilling plans, etc.) to be produced quickly with assured coherency.

The PETREL framework can be part of the DELFI cognitive exploration and production (E&P) environment (SLB, Houston, Texas), referred to as the DELFI environment, for utilization in geosciences and geoengineering, for example, to analyze subsurface data from exploration to production of fluid from a reservoir.

The DELFI environment is a secure, cognitive, cloud-based collaborative environment that integrates data and workflows with digital technologies, such as artificial intelligence and machine learning. As an example, such an environment can provide for operations that involve one or more frameworks. The DELFI environment may be referred to as the DELFI framework, which may be a framework of frameworks. As an example, the DELFI framework can include various other frameworks, which can include, for example, one or more types of models (e.g., simulation models, machine learning models, etc.).

The TECHLOG framework can handle and process field and laboratory data for a variety of geologic environments (e.g., deepwater exploration, shale, etc.). The TECHLOG framework can structure wellbore data for analyses, planning, etc.

The PETROMOD framework provides petroleum systems modeling capabilities that can combine one or more of seismic, well, and geological information to model the evolution of a sedimentary basin. The PETROMOD framework can predict if, and how, a reservoir has been charged with hydrocarbons, including the source and timing of hydrocarbon generation, migration routes, quantities, and hydrocarbon type in the subsurface or at surface conditions.

The ECLIPSE framework provides a reservoir simulator (e.g., as a computational framework) with numerical solutions for fast and accurate prediction of dynamic behavior for various types of reservoirs and development schemes.

The INTERSECT framework provides a high-resolution reservoir simulator for simulation of detailed geological features and quantification of uncertainties, for example, by creating accurate production scenarios and, with the integration of precise models of the surface facilities and field operations, the INTERSECT framework can produce reliable results, which may be continuously updated by real-time data exchanges (e.g., from one or more types of data acquisition equipment in the field that can acquire data during one or more types of field operations, etc.). The INTERSECT framework can provide completion configurations for complex wells where such configurations can be built in the field, can provide detailed chemical-enhanced-oil-recovery (chemical EOR) formulations where such formulations can be implemented in the field, can analyze application of steam injection and other thermal EOR techniques for implementation in the field, advanced production controls in terms of reservoir coupling and flexible field management, and flexibility to script customized solutions for improved modeling and field management control. The INTERSECT framework, as with the other example frameworks, may be utilized as part of the DELFI environment, for example, for rapid simulation of multiple concurrent cases. For example, a workflow may utilize one or more of the DELFI environment on demand reservoir simulation features.

The aforementioned DELFI environment provides various features for workflows as to subsurface analysis, planning, construction and production, for example, as illustrated in the workspace framework 110. As shown in FIG. 1, outputs from the workspace framework 110 can be utilized for directing, controlling, etc., one or more processes in the geologic environment 150 and, feedback 160, can be received via one or more interfaces in one or more forms (e.g., acquired data as to operational conditions, equipment conditions, environment conditions, etc.).

In the example of FIG. 1, the visualization features 123 may be implemented via the workspace framework 110, for example, to perform tasks as associated with one or more of subsurface regions, planning operations, constructing wells and/or surface fluid networks, and producing from a reservoir.

As an example, visualization features can provide for visualization of various earth models, properties, etc., in one or more dimensions. As an example, visualization features can provide for rendering of information in multiple dimensions, which may optionally include multiple resolution rendering. In such an example, information being rendered may be associated with one or more frameworks and/or one or more data stores. As an example, visualization features may include one or more control features for control of equipment, which can include, for example, field equipment that can perform one or more field operations. As an example, a workflow may utilize one or more frameworks to generate information that can be utilized to control one or more types of field equipment (e.g., drilling equipment, wireline equipment, fracturing equipment, etc.).

As an example, a model may be a simulated version of an environment, which may include one or more sites of possible emissions (e.g., greenhouse gas, etc.). As an example, a simulator may include features for simulating physical phenomena in an environment based at least in part on a model or models. A simulator, such as a weather simulator, can simulate fluid flow in an environment based at least in part on a model that can be generated via a framework that receives satellite data. A simulator can be a computerized system (e.g., a computing system) that can execute instructions using one or more processors to solve a system of equations that describe physical phenomena subject to various constraints. In such an example, the system of equations may be spatially defined (e.g., numerically discretized) according to a spatial model (e.g., of the Earth, the atmosphere, the oceans, etc.).

While several simulators are illustrated in the example of FIG. 1, one or more other simulators may be utilized, additionally or alternatively. For example, consider the VISAGE geomechanics simulator (SLB, Houston Texas) or the PIPESIM network simulator (SLB, Houston Texas), etc. The VISAGE simulator includes finite element numerical solvers that may provide simulation results such as, for example, results as to compaction and subsidence of a geologic environment, well and completion integrity in a geologic environment, cap-rock and fault-seal integrity in a geologic environment, fracture behavior in a geologic environment, thermal recovery in a geologic environment, CO2 disposal, etc. The PIPESIM simulator includes solvers that may provide simulation results such as, for example, multiphase flow results (e.g., from a reservoir to a wellhead and beyond, etc.), flowline and surface facility performance, etc. The PIPESIM simulator may be integrated, for example, with the AVOCET production operations framework (SLB, Houston, Texas).

As an example, the KINETIX reservoir-centric stimulation-to-production framework (SLB, Houston, Texas) may be utilized, which can integrate geology, petrophysics, completion engineering, reservoir engineering, and geomechanics for tasks such as optimization of completions, fracturing designs for a well, a pad, or a whole field, etc. As an example, from 1D logs and geometric completions to full 3D mechanical and petrophysical models coupled with the INTERSECT reservoir simulator and VISAGE finite-element geomechanics simulator, the KINETIX framework provides various options for various workflows. For example, the KINETIX framework can provide for automated parallel processing in the cloud, for example, to facilitate rapid assessment of well spacing, completion, and treatment design choices (e.g., to explore thousands of scenarios in hours rather than weeks).

Phenomena associated with a sedimentary basin (e.g., a subsurface region, whether below a ground surface, water surface, etc.) may be modeled using various equations (e.g., stress, fluid flow, phase, etc.). As an example, a numerical model of a basin may find use for understanding various processes related to exploration and production of natural resources (e.g., estimating reserves in place, drilling wells, forecasting production, controlling fracturing, etc.).

For application of a numerical technique, equations may be discretized using nodes, cells, etc. For example, a numerical technique such as the finite difference method can include discretizing a differential heat equation for temperature with respect to a spatial coordinate or spatial coordinates to approximate temperature derivatives (e.g., first order, second order, etc.). While temperature is mentioned, the finite difference method can be utilized for one or more of various variables (e.g., pressure, fluid flow, stress, strain, etc.). Further, where time is of interest, a derivative of a variable or variables with respect to time may be provided.

As to a spatial coordinate, a numerical technique may rely on a spatial grid that includes various nodes where one or more variables such as, for example, temperature, pressure, fluid velocity, etc., can be provided for the nodes upon solving appropriate equations (e.g., subject to boundary conditions, generation terms, etc.). Such an example may apply to multiple dimensions in space (e.g., where discretization is applied to the multiple dimensions). Thus, a grid may discretize a volume of interest (VOI) into elementary elements (e.g., cells or grid blocks) that may be assigned or associated with properties (e.g., porosity, permeability, rock type, etc.), which may be germane to simulation of physical processes (e.g., temperature, pressure, fluid flow, fracturing, reservoir compaction, etc.).

As another example of a numerical technique, consider the finite element method where space may be represented by one dimensional or multi-dimensional "elements". For one spatial dimension, an element may be represented by two nodes positioned along a spatial coordinate. For multiple spatial dimensions, an element may include any number of nodes. Further, some equations may be represented by the total number nodes while others are represented by fewer than the total number of nodes (e.g., consider an example for the Navier-Stokes equations where fewer than the total number of nodes represent pressure). The finite element method may include providing nodes that can define triangular elements (e.g., tetrahedra in 3D, higher order simplexes in multidimensional spaces, etc.) or quadrilateral elements (e.g., hexahedra or pyramids in 3D, etc.), or polygonal elements (e.g., prisms in 3D, etc.). Such elements, as defined by corresponding nodes of a grid, may be referred to as grid cells.

Yet another example of a numerical technique is the finite volume method. For the finite volume method, values for model equation variables may be calculated at discrete places on a grid, for example, a node of the grid that includes a "finite volume" surrounding it. The finite volume method may apply the divergence theorem for evaluation of fluxes at surfaces of each finite volume such that flux entering a given finite volume equals that leaving to one or more adjacent finite volumes (e.g., to adhere to conservation laws). For the finite volume method, nodes of a grid may define grid cells.

As an example, a structured grid may facilitate various types of operations such as those related to matrices, for example, where nearest neighbors may form clusters or bands within a matrix. In turn, a matrix may be handled using a pre-conditioner, a banded solver and/or one or more other suitable techniques. As to a solver for an unstructured grid, as an example, it may rely on input of connectivity information that specifies how grid nodes relate to individual cells. In such an example, a matrix that may not be readily amenable to a banded or other matrix handling technique, can, in turn, increase computational resource demands, computation time, etc.

Where a sedimentary basin (e.g., subsurface region) includes various types of features (e.g., stratigraphic layers, fractures, faults, etc.), nodes, cells, etc., may represent, or be assigned to, such features. In turn, discretized equations may better represent the sedimentary basin and its features. As an example, a structured grid that can represent a sedimentary basin and its features, when compared to an unstructured grid, may allow for more simulation runs, more model complexity, less computational resource demands, less computation time, etc. In various examples, a structured approach and/or an unstructured approach may be utilized.

Figure 2:
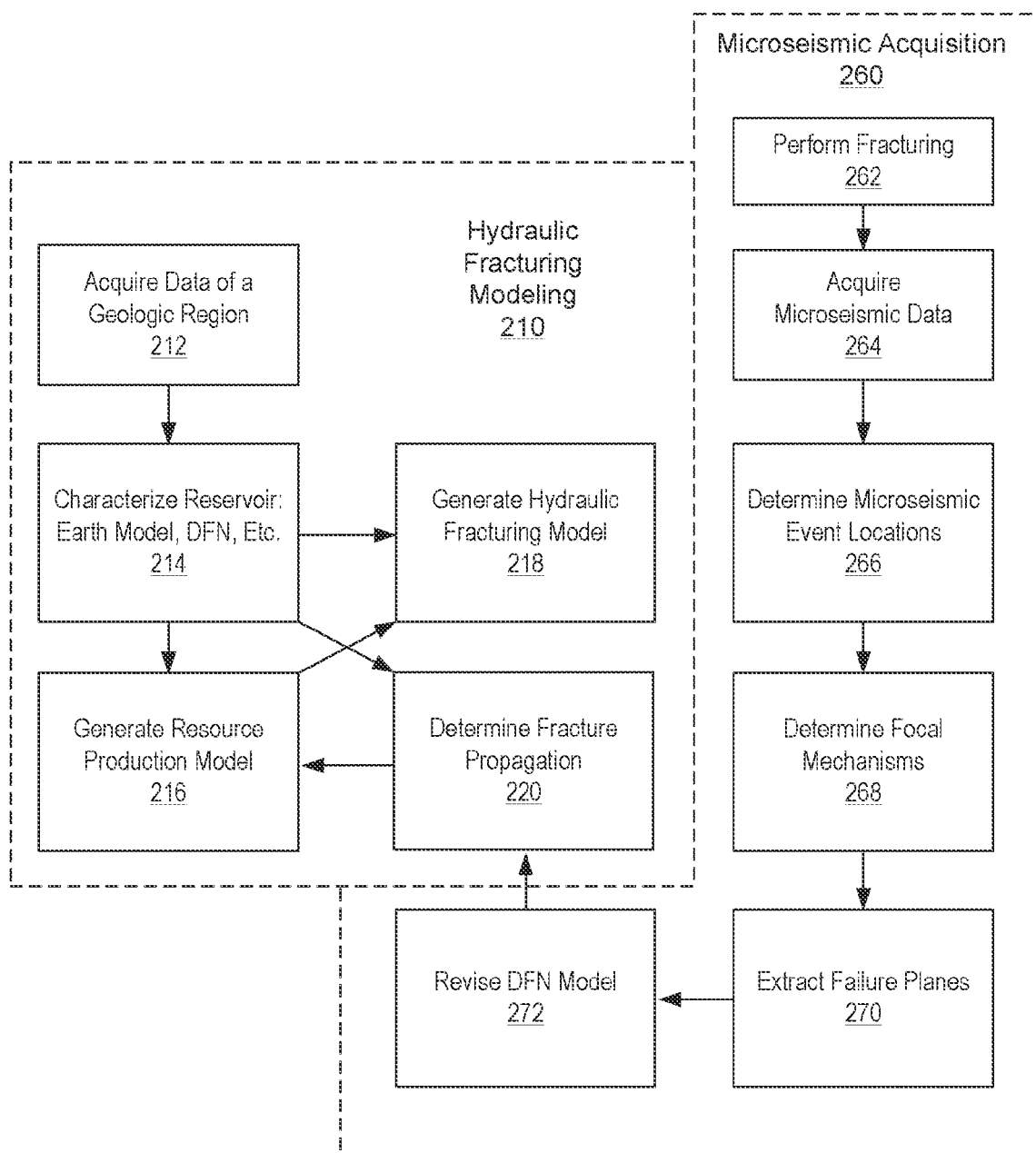
FIG. 2 illustrates an example of a method.

FIG. 2 shows an example of a method 200 that includes various actions associated with hydraulic fracturing modeling 210 and various actions associated with microseismic data acquisition 260. Such a method may be utilized in combination with one or more pieces of equipment, for example, to perform operations, acquire data, etc.

As shown in the example of FIG. 2, the method 200 includes an acquisition block 212 for acquiring data of a geologic region, a characterization block 214 for characterizing a reservoir in the geologic region via a 3D earth model and a discrete fracture network (DFN) and optionally one or more other actions, a generation block 216 for generating a resource production model of the geologic region, a generation block 218 for generating a hydraulic fracturing model and a determination block 220 for determining information associated with fracture propagation in the geologic region. As shown, the method 200 includes a performance block 262 for performing hydraulic fracturing in the geologic region, an acquisition block 264 for acquiring microseismic data responsive to generation and/or reactivation of fractures in the geologic region, a determination block 266 for determining microseismic event locations in the geologic region, a determination block 268 for determining one or more focal mechanisms based at least in part on the microseismic event locations, an extraction block 270 for extracting one or more failure planes based at least in part on the determined one or more focal mechanisms in the geologic region, a revision block 272 for revising the DFN model that characterizes the reservoir where, as shown, the revised DFN model can be utilized to inform the determination block 220 as to fracture propagation in the geologic region noting that one or more loops can exist within the method 200 that can be performed responsive to fracturing and data acquisition, which can inform, for example, one or more operations in the geologic region (e.g., further fracturing, further data acquisition, production, etc.).

Mechanical earth models (e.g., "MEMs", 3D earth models, etc.) can be generated from a variety of geologic, petrophysical, geomechanical, and geophysical information, which characterizes complexity and heterogeneity of a reservoir and completion properties in one or more formations of interest (see, e.g., the block 214). As an example, data can be acquired via one or more of 3D seismic surveys, acoustic impedance and other seismic-derived property volumes (e.g., bulk modulus, Poisson's ratio, etc.), microseismic surveys, sonic logs, rock cores, burial history, petrophysical measurements from well logs, etc. (see, e.g., the block 212).

As an example, natural fracture patterns and regional stress field may be mapped using such multi-domain, multi-scale information as borehole images and 2D and 3D seismic surveys, which can then be used to develop and calibrate fracture propagation models (see, e.g., the block 220). As an example, a mechanical earth model (MEM) may be used to generate maps to asses, perform, etc., one or more of drilling, fracturing, and operational risks. As explained with respect to FIG. 2, the method 200 can include integrating hydraulic fracturing models (see, e.g., the block 218) developed through integration of geologic and structural models with production simulation models and risk maps (see, e.g., the block 216), which can provide for decision making for completion operations, execution of an optimum stimulation plan, etc.

As an example, hydraulic fracturing models developed through the integration of geologic and structural reservoir characterization models, fracture propagation models and production models may be utilized in evaluating different unconventional completion operations. For example, consider operations that include real-time microseismic data acquisition for evaluating performance of hydraulic fracturing stimulations and in providing information about for calibrating and developing revised fracture models for one or more of ongoing and future stimulations.

Microseismic monitoring provides a valuable tool to evaluate hydraulic fracture treatments in real-time and can be utilized in planning and managing reservoir development. Microseismic event locations, source characteristics and attributes provide can provide estimates of hydraulic fracturing geometry that can be evaluated with respect to a completion plan and expected fracture growth. Microseismic event derived attributes such as fracture azimuth, height and length, location and complexity, may be utilized to determine the extent of fracture coverage of the reservoir target and effective stimulated volume, as well as in diagnosing under-stimulated sections of the reservoir and in planning re-stimulation of under-producing perforations and wells. Microseismic event locations can also help to avoid hazards during stimulation (e.g., faults, karst, aquifers, etc.). As an example, a method can include modifications to one or more treatment plans and operations based at least in part on microseismic interpretations.

As an example, microseismic monitoring results may be used in updating and calibrating geologic and structural models used in planning completions. Information about the inelastic deformation of the fracture source (fracture plane orientation and slip) that generates the microseismic signal may be, for example, obtained through moment tensor inversion. The moment tensor can describe various source types (e.g., explosion, tensile crack opening or closing, slip on a plane or combination thereof). As hydraulic fracture microseismicity can be a result of high-pressure injection of fluids and proppant to open fracture paths, moment tensor inversion can be used to determine fracture opening and closing events from shear displacements, providing valuable information to engineers as to whether their fractures pathways are open or closed.

Integrated workflows leveraging multi-scale, multi-domain measurements and microseismic interpretation can enable optimization of hydraulic fracturing treatment for increased production, optionally in real-time (e.g., consider a controller that operates based in part on microseismic data, etc.). Integrated completions planning workflows may use a wide variety of information about the geology (e.g., lithology, stress contrast, natural fracturing, structural or depositional dip, faulting), and the associated rock properties, (e.g., noise, slowness, anisotropy, attenuation) to improve hydraulic fracturing operations to lead to improved hydraulic fracture stimulations, completion plans, and well placement and, thereby, improved production. As an example, microseismic event locations and attributes may be integrated and compared with treatment pressure records, proppant concentration, and injection rate to better perform field operations.

Figure 3:
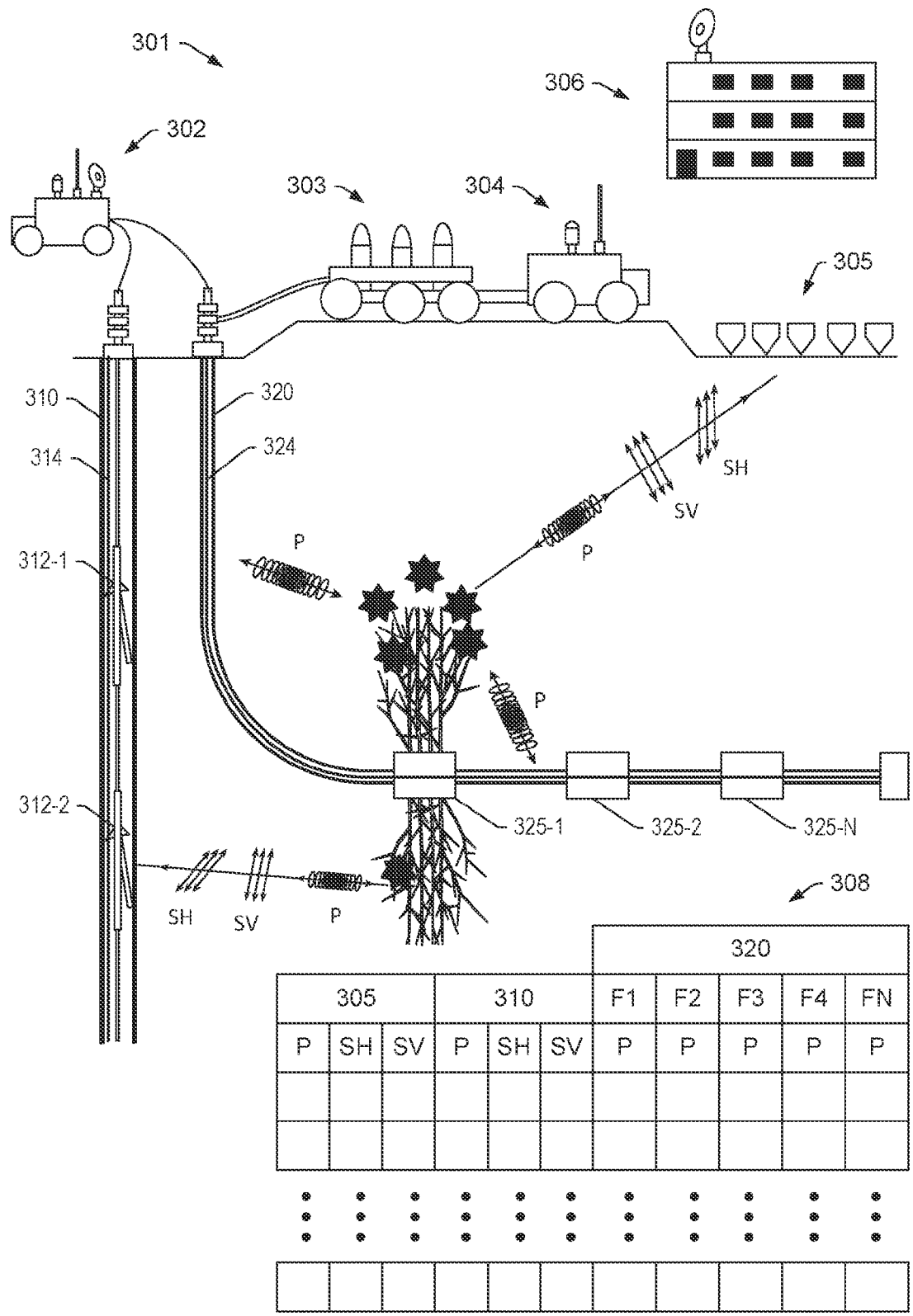
FIG. 3 illustrates an example of a system.

FIG. 3 shows an example of a geologic environment 301 that includes monitoring equipment 302, a pump 303, equipment 304, a seismic sensor or receiver array 305 and a remote facility 306. As shown, various types of communication may be implemented such that one or more pieces of equipment can communicate with one or more other pieces of equipment. As an example, equipment can include geo-positioning equipment (e.g., GPS, etc.). As an example, equipment can include one or more satellites and one or more satellite links (e.g., dishes, antennas, etc.).

In the example of FIG. 3, a monitoring well 310 and a treatment well 320 are disposed in the geologic environment 301. The monitoring well 310 includes a plurality of sensors 312-1 and 312-2 and optionally a fiber cable sensor 314 and the treatment well 320 optionally includes a fiber cable sensor 324 and one or more sets of perforations 325-1, 325-2, and 325-N (e.g., as generated by perforating equipment, which may utilize force generated via one or more mechanisms).

Equipment in the example of FIG. 3 can be utilized to perform one or more methods. As an example, data associated with hydraulic fracturing events may be acquired via various sensors. As an example, P-wave data (compressional wave data) can be utilized to assess such events (e.g., microseismic events). Such information may allow for adjusting one or more field operations. As an example, data acquired via the fiber cable sensor 324 can be utilized to generate information germane to a fluid flow-based treatment process (e.g., to determine where fluid pumped into a well may be flowing, etc.).

FIG. 3 shows an example of a table or data structure 308 with some examples of information that may be acquired via the seismic sensor array 305 (e.g., P-wave as "P", SH-wave as "SH", SV-wave as "SV"), sensors of the monitoring well 310 (e.g., P, SH, SV) and sensors of the treatment well 320 (e.g., P). In the example of FIG. 3, information may be sensed with respect to position, for example, sensor position, position along a fiber cable sensor, etc. As shown, the fiber cable sensor 324 may sense information at a variety of positions along the fiber cable sensor 324 within the treatment well 320 (see, e.g., F1, F2, F3, F4 to FN).

In the example of FIG. 3, the set of perforations 325-1 are shown as including associated fractures and microseismic events that generate energy that can be sensed by various sensors in the geologic environment 301. Arrows indicate a type of wave that may be sensed by an associate sensor. For example, as mentioned with respect to the table or data structure 308, the seismic sensor array 305 can sense P, SV and SH waves while the fiber cable sensor 324 can sense P waves.

As an example, the equipment 302 can be operatively coupled to various sensors in the monitor well 310 and the treatment well 320. As an example, the equipment 302 may be on-site where wires are coupled from sensors to the equipment 302, which may be vehicle-based equipment (e.g., a data acquisition and/or control truck, etc.). As an example, the equipment 304 may control the pump 303 (e.g., or pumps) that can direct fluid into the treatment well 320.

For example, a line is shown as a conduit that is operatively coupled between the pump 303 and the treatment well 320.

As an example, information acquired by the equipment 302 may be utilized to control one or more treatment processes controlled by the equipment 304. For example, the equipment 302 and the equipment 304 may be in direct and/or indirect communication via one or more communication links (e.g., wire, wireless, local, remote, etc.). In such an example, information acquired during a treatment process can be utilized in real-time (e.g., near real-time) to control the treatment process. For example, the equipment 302 can acquire data via sensors in the wells 310 and 320 and output information to the equipment 304 for purposes of controlling an on-going treatment process. As an example, such information may be utilized to control and/or to plan a subsequent treatment process, for example, additionally or alternatively to controlling an on-going treatment process.

As an example, a treatment process can include hydraulic fracturing. As an example, acquired data can include microseismic event data. As an example, a method can include determining the extent of rock fracturing induced by a treatment process, which may aim to stimulate a reservoir.

A stimulation (or a stimulation treatment) may be performed to restore or enhance the productivity of a well. Types of stimulations can include hydraulic fracturing treatments and matrix treatments. Fracturing treatments can be performed above a fracture pressure of a reservoir formation and aim to create a conductive flow path between the reservoir and a wellbore. Matrix treatments can be performed below a reservoir fracture pressure and may be designed to restore natural permeability of the reservoir (e.g., following damage to the near-wellbore area, etc.). As an example, stimulation in shale gas reservoirs can involve hydraulic fracturing treatments.

As an example, a method can include hydraulic fracture monitoring (HFM). As an example, a method can include monitoring one or more types of reservoir stimulation processes where one or more of such processes may be performed in stages. As an example, a stage may be of a duration of the order of hours or longer (e.g., several days). As an example, a method can include determining the presence, extent, and/or associated volume of induced fractures and fracture networks, which may be utilized for calculating an estimated reservoir stimulation volume (e.g., RSV) that may assist, for example, in economic evaluation of well performance.

As an example, real-time data may be rendered to a display (e.g., as a plot, plots, etc.). As an example, real-time data may be assessed in real-time (e.g., near real-time that includes computation and transmission times) during perforation flow for one or more sets of perforations. In such an example, such assessments may allow a treatment process to be optimized during the treatment process in real-time (e.g., near real-time). Such assessments may be utilized for one or more post treatment analyses, for example, to plan, perform, control, etc. one or more future treatments (e.g., in a same well, a different well, etc.).

As an example, a method can include acquiring data germane to flow in one or more wells and/or via perforations in one or more wells. As an example, a method can include acquiring data germane to locating one or more fractures. As an example, a method can include a real-time portion and a post-process portion.

As an example, a data acquisition technique may be implemented to help understand a formation, a reservoir, a bore, a bore wall, a fracture, fractures, a fracture network, etc. As an example, a hydraulically induced fracture or fractures may be monitored using one or more borehole seismic methods. For example, while a fracture is being created in a treatment well, a multicomponent receiver array in a monitor well may be used to record microseismic activity generated by a fracturing process.

As mentioned, equipment may include fracturing equipment where such equipment may be employed to generate one or more fractures in a geologic environment. As an example, a method to generate fractures can include a delivery block for delivering fluid to a subterranean environment, a monitor block for monitoring fluid pressure and a generation block for generating fractures via fluid pressure. As an example, the generation block may include activating one or more fractures. As an example, the generation block may include generating and activating fractures.

As an example, a method may be referred to as a treatment method or a "treatment". Such a method may include pumping an engineered fluid (e.g., a treatment fluid) at high pressure and rate into a reservoir via one or more bores, for example, to one or more intervals to be treated, which may cause a fracture or fractures to open (e.g., new, pre-existing, etc.). Such a method may be referred to as a stimulation method or stimulation treatment method.

As an example, a fracture may be defined as including "wings" that extend outwardly from a bore. Such wings may extend away from a bore in opposing directions, for example, according in part to natural stresses within a formation. As an example, proppant may be mixed with a treatment fluid to keep a fracture (or fractures) open when a treatment is complete. Hydraulic fracturing may create relatively high-conductivity communication with an area of a formation and, for example, may bypass damage that may exist in a near-wellbore area. As an example, stimulation treatment may occur in stages. For example, after completing a first stage, data may be acquired and analyzed for planning and/or performance of a subsequent stage.

Size and orientation of a fracture, and the magnitude of the pressure to create it, may be dictated at least in part by a formation's in situ stress field. As an example, a stress field may be defined by three principal compressive stresses, which are oriented perpendicular to each other. The magnitudes and orientations of these three principal stresses may be determined by the tectonic regime in the region and by depth, pore pressure and rock properties, which determine how stress is transmitted and distributed among formations.

Where fluid pressure is monitored, a sudden drop in pressure can indicate fracture initiation of a stimulation treatment, as fluid flows into the fractured formation. As an example, to break rock in a target interval, fracture initiation pressure exceeds a sum of the minimum principal stress plus the tensile strength of the rock. To determine fracture closure pressure, a process may allow pressure to subside until it indicates that a fracture has closed. A fracture reopening pressure may be determined by pressurizing a zone until a leveling of pressure indicates the fracture has reopened. The closure and reopening pressures tend to be controlled by the minimum principal compressive stress (e.g., where induced downhole pressures exceed minimum principal stress to extend fracture length).

After performing fracture initiation, a zone may be pressurized for furthering stimulation treatment. As an example, a zone may be pressurized to a fracture propagation pressure, which is greater than a fracture closure pressure. The difference may be referred to as the net pressure, which represents a sum of frictional pressure drop and fracture-tip resistance to propagation (e.g., further propagation).

As an example, a method may include seismic monitoring during a treatment operation (e.g., to monitor fracture initiation, growth, etc.). For example, as fracturing fluid forces rock to crack and fractures to grow, small fragments of rock break, causing tiny seismic emissions, called microseisms. Equipment may be positioned in a field, in a bore, etc. to sense such emissions and to process acquired data, for example, to locate microseisms in the subsurface (e.g., to locate hypocenters). Information as to direction of fracture growth may allow for actions that can "steer" a fracture into a desired zone(s) or, for example, to halt a treatment before a fracture grows out of an intended zone. Seismic information (e.g., information associated with microseisms) may be used to plan one or more stages of fracturing operations (e.g., location, pressure, etc.).

Figure 4:
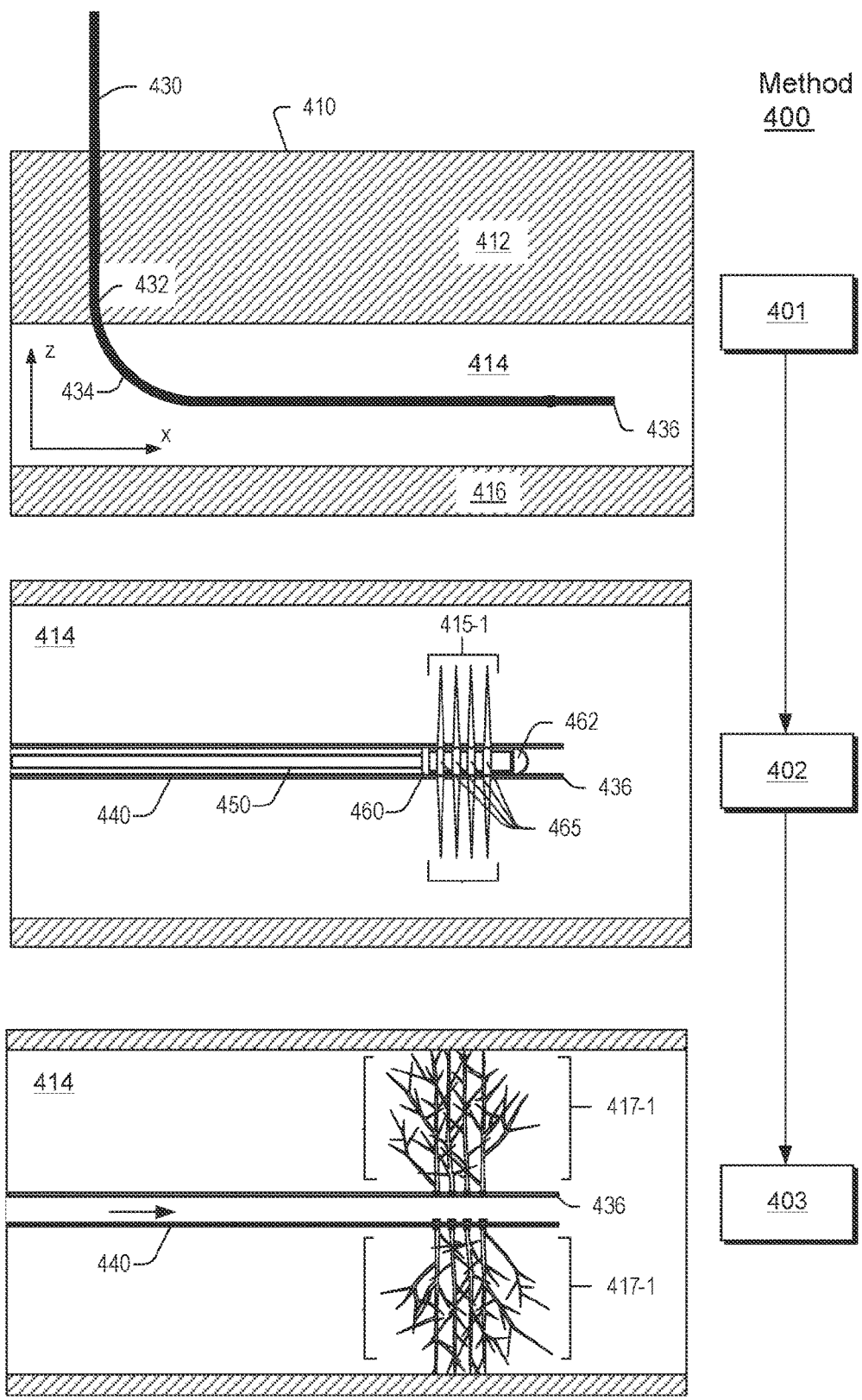
FIG. 4 illustrates an example of a portion of a method.
Figure 5:
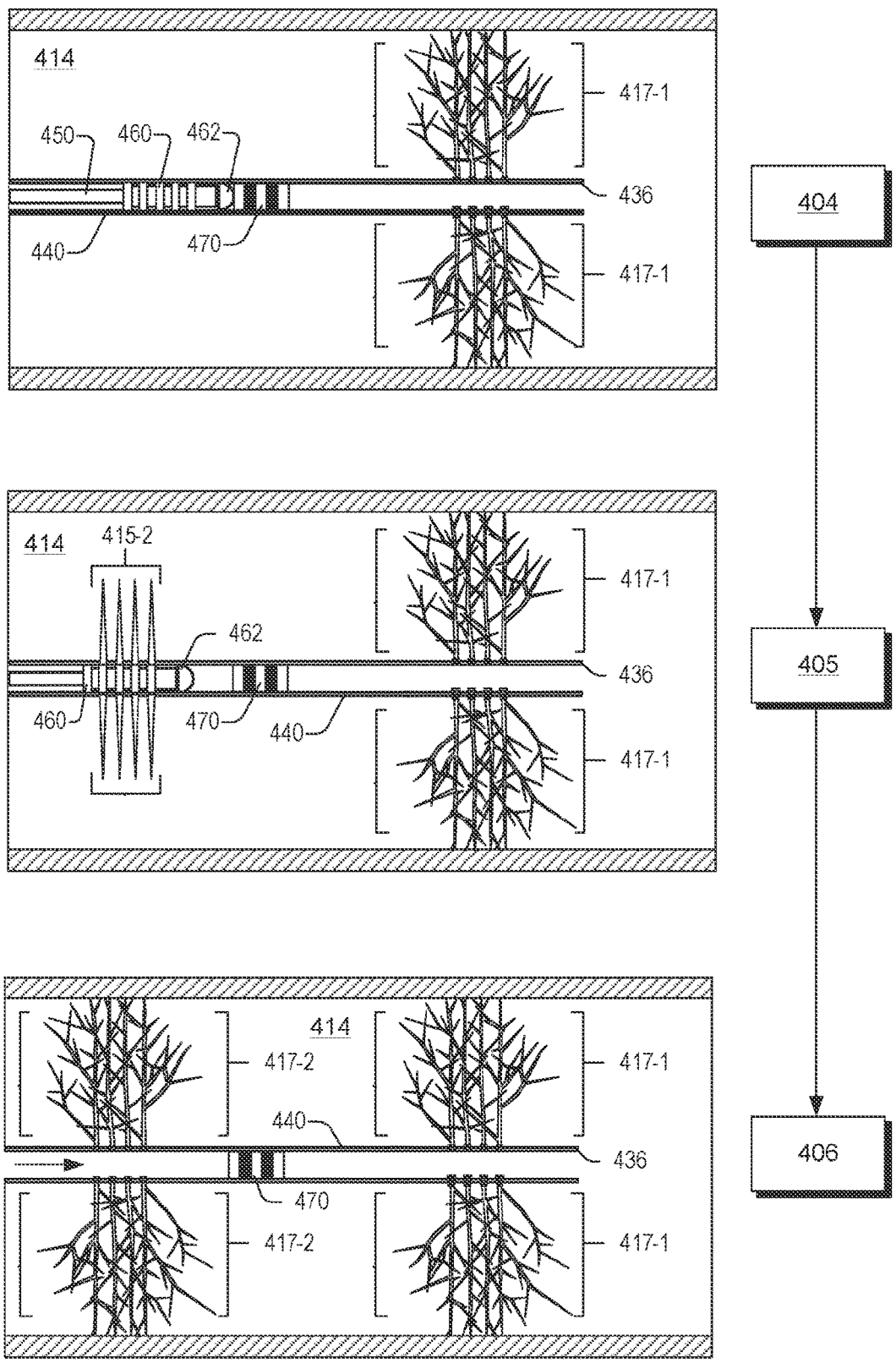
FIG. 5 illustrates an example of a portion of the method of FIG. 4.

FIG. 4 and FIG. 5 show an example of a method 400 that includes generating fractures. As shown, the method 400 can include various operational blocks such as one or more of the blocks 401, 402, 403, 404, 405 and 406. The block 401 may be a drilling block that includes drilling into a formation 410 that includes layers 412, 414 and 416 to form a bore 430 with a kickoff 432 to a portion defined by a heel 434 and a toe 436, for example, within the layer 414.

As illustrated with respect to the block 402, the bore 430 may be at least partially cased with casing 440 into which a string or line 450 may be introduced that carries a perforator 460. As shown, the perforator 460 can include a distal end 462 and charge positions 465 associated with activatable charges that can perforate the casing 440 and form channels 415-1 in the layer 414. Next, per the block 403, fluid may be introduced into the bore 430 between the heel 434 and the toe 436 where the fluid passes through the perforations in the casing 440 and into the channels 415-1. Where such fluid is under pressure, the pressure may be sufficient to fracture the layer 414, for example, to form fractures 417-1. In the block 403, the fractures 417-1 may be first stage fractures, for example, of a multistage fracturing operation.

Per the block 404, additional operations are performed for further fracturing of the layer 414. For example, a plug 470 may be introduced into the bore 430 between the heel 434 and the toe 436 and positioned, for example, in a region between first stage perforations of the casing 440 and the heel 434. Per the block 405, the perforator 460 may be activated to form additional perforations in the casing 440 (e.g., second stage perforations) as well as channels 415-2 in the layer 414 (e.g., second stage channels). Per the block 406, fluid may be introduced while the plug 470 is disposed in the bore 430, for example, to isolate a portion of the bore 430 such that fluid pressure may build to a level sufficient to form fractures 417-2 in the layer 414 (e.g., second stage fractures).

In a method such as the method 400 of FIG. 4 and FIG. 5, it may be desirable that a plug (e.g., the plug 470) includes properties suited to one or more operations. Properties of a plug may include mechanical properties (e.g., sufficient strength to withstand pressure associated with fracture generation, etc.) and may include one or more other types of properties (e.g., chemical, electrical, etc.). As an example, it may be desirable that a plug degrades, that a plug seat degrades, that at least a portion of a borehole tool degrades, etc. For example, a plug may be manufactured with properties such that the plug withstands, for a period of time, conditions associated with an operation and then degrades (e.g., when exposed to one or more conditions). In such an example, where the plug acts to block a passage for an operation, upon degradation, the passage may become unblocked, which may allow for one or more subsequent operations.

One or more types of models may be utilized for modeling of one or more fractures in a reservoir. For example, a trilinear model may be utilized that includes a first region of idealized linear flow in a reservoir region within a length of fractures. Within the first region, linear flow may be assumed to exist in which fluid flow is normal to a plane of one or more vertical fractures. In such an example, reservoir volume may be defined by lengths of vertical fractures, formation thickness, number of vertical fractures, and spacing between adjacent fractures. As an example, a second region in a trilinear model may be for idealized linear flow within a fracture and a third region may be for idealized linear flow in one or more reservoir regions beyond a length of vertical fracture(s). In low permeability reservoirs (e.g., such as fractured shale gas and oil reservoirs), contribution to production of a well from a reservoir region that lies beyond a stimulated volume may be negligible in practice.

A workflow may account for various factor such as, for example, engineered completion design that accounts for one or more of reservoir heterogeneity and stress variation in the formation; interaction between natural fractures and hydraulic fractures; stress shadow effects near the vicinity of a fracture which influences the shape and characteristics of fractures created within its influence; frac hit events where an offset well is affected by the pumping of a hydraulic fracturing treatment in a nearby well; a depletion shadow which causes stress changes due to production, which can be considered for designing infill wells and/or refracturing existing wells; etc.

As an example, the KINETIX framework can be implemented as a plugin for the PETREL framework to support multistage completion, stimulation design, and production evaluation for conventional and unconventional reservoirs. As mentioned, one or more types of modeling approaches may be utilized such as, for example, P3D (Pseudo 3D) and MLF_P3D models, which are single and multi-initiation point planar fracture models for horizontal and vertical wells which though approximate tend to be relatively computationally efficient. In well-defined sandstone formations bounded by stress barriers such as shales these models may suffice. As another example, consider a Planar3D model, which can provide an accurate solution if an assumption as to planar fracture(s) is accurate. Such planar models can be computationally intensive and may utilize cloud computing, parallel processing, etc. As yet another example, consider an Unconventional Fracture Model (UFM), which can be utilized to predict propagation of complex hydraulic fracture networks in a formation with pre-existing natural fractures. A UFM model can consider interaction among hydraulic fracture branches by computing the stress shadow effect on each fracture exerted by the adjacent fractures.

The effective placement of proppant in a fracture may have a dominant effect on well productivity and be taken into account while modeling. Various proppant transport models are 1D and can consider proppant settling in each cell. To model advanced fracturing technologies such as heterogeneous proppant placement (HIWAY), fiber-laden slurries, proppant mixtures, and so on, a more sophisticated approach for modeling transport of solids may be utilized. For example, the KINETIX framework can utilize a Multiphysics Planar3D/P3D advanced transport model.

Simulation can include simulating fracture creation and simulating reservoir flow in a manner that accounts for a created fracture or created fractures, which, as mentioned, may communicate with natural fractures. As an example, reservoir simulation may be performed for an entire well pad or reservoir region. As an example, production gridding and numerical simulation can be implemented for evaluating well performance after stimulation treatment design and/or after actual stimulation. As an example, in the KINETIX framework, hydraulic fractures may be modeled explicitly. In such an approach, production gridding can involve creating a simulation grid that is geometrically refined to one or more fractures, where the simulation grid (e.g., model grid) can account for reservoir matrix and hydraulic fracture properties. As an example, a fracture grid may be either structured or unstructured. As explained, numerical simulations can be run on a grid using the INTERSECT reservoir simulator.

As explained, physical phenomena and operational conditions can impact a reservoir. For example, as reservoir pressure declines due to production, a depletion region can be formed near a stimulated area, which can cause a change in magnitude and azimuth of in-situ stresses. Such a phenomenon can be modeled using the KINETIX framework by coupling the reservoir simulator (e.g., INTERSECT, etc.) with a geomechanical finite element simulator (e.g., VISAGE, etc.). As an example, a simulation can be a multi-simulator type of simulation that can generate results that can account for various types of physical phenomena (e.g., fluid flow, geomechanics, etc.).

As explained, a method can include fine-tuning using field data to help to ensure validity of one or more models. For example, calibrating a hydraulic fracture model using microseismic data can help in building confidence in the hydraulic fracture geometry. As an example, a reservoir simulation model may be history matched with pressure and production data to help ensure proper material balance computations over time.

As an example, a hydraulic fracturing process can be characterized using one or more of a variety of techniques to estimate and/or sample a stimulated rock volume (SRV), which is a volume of stimulated rock within a region of a reservoir. Knowledge of SRV may be utilized to improve simulations, to improve fracturing stimulations, to improve hydrocarbon recovery, etc. Integration of various techniques may provide for improved characterization of SRV and stimulated fractures, and an improvement in fracturing processes (e.g., planning, control, completions, etc.).

In the oil and gas industry, the concept of the stimulated rock volume (SRV) can be an empirical replacement for reliable modeling of highly complex fracture networks. A SRV can represent the total volume of reservoir rock that has been hydraulically fractured and its calculations can be based on locations of microseismic events recorded during stimulation, optionally with integration of other data.

As mentioned, microseismic survey data can be utilized to characterize one or more SRVs, for example, to map fracture density. As an example, a technique can combine microseismic measurements with one or more other approaches to accurately sample one or more SRVs and characterize fracturing. For instance, core, image logs, and pressure data may be utilized, which can aid in determining fracture orientation and width. As to some other approaches, consider Distributed Acoustic Sensing (DAS) and Distributed Temperature Sensing (DTS). DAS is the measure of Rayleigh scatter distributed along a fiber optic cable.

Figure 6:
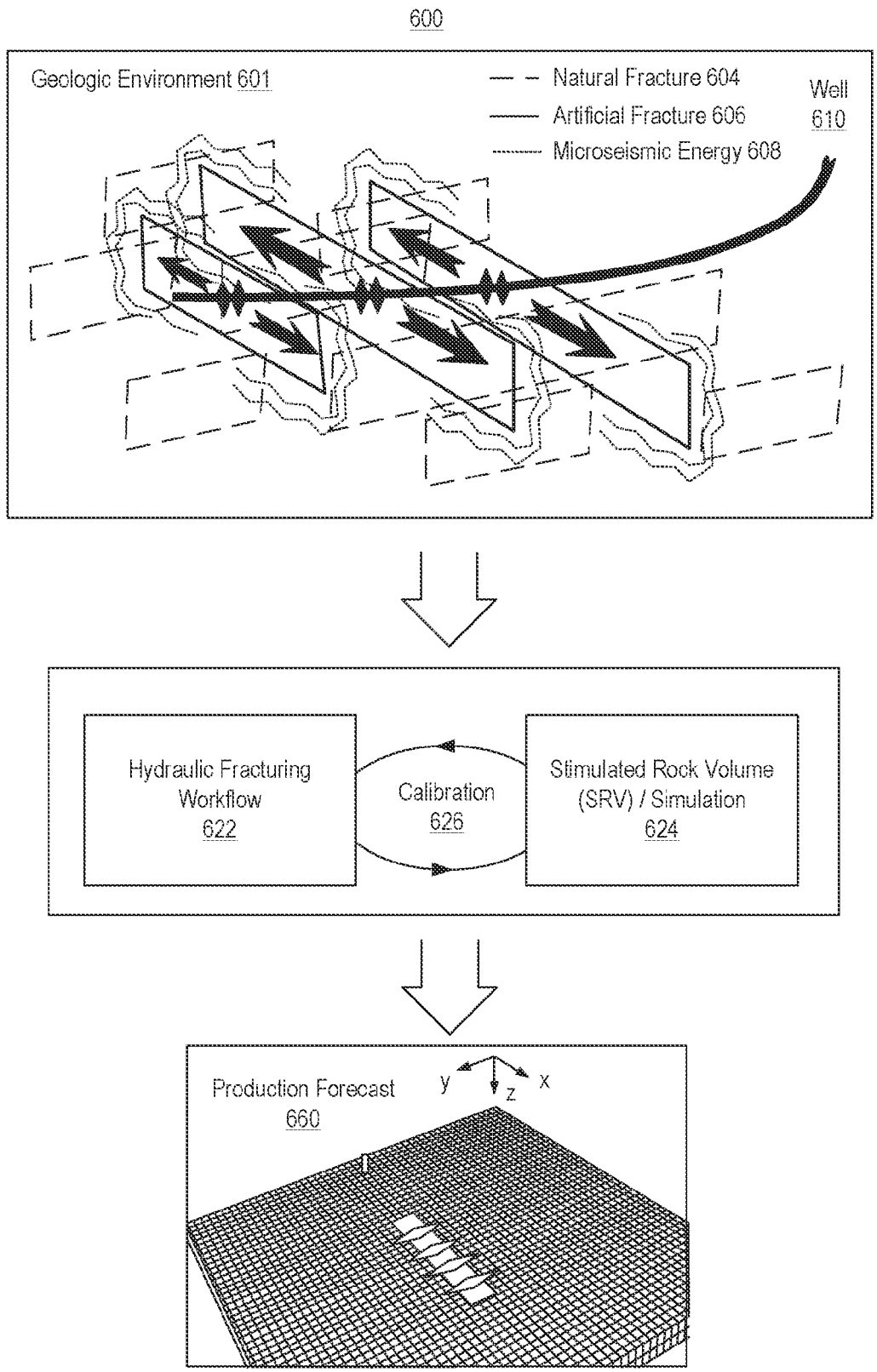
FIG. 6 illustrates an example of a method.

FIG. 6 shows an example of a method 600 that may be a workflow as implemented by a hydraulic fracturing system, which may include physical equipment for use in the field and/or computational equipment that may be operatively coupled to equipment in the field (e.g., for control, data acquisition, etc.). For example, consider the equipment of the example of FIG. 3. As shown in FIG. 6, fracturing can be performed in a geologic environment 601 via a well 610 where natural fractures 604 can exist, artificial fractures 606 can be generated, and microseismic energy 608 can be emitted. As shown in FIG. 6, the method 600 can include performing a hydraulic fracturing workflow 622 along with stimulated rock volume estimation and/or simulation 624, which may be utilized in calibration 626 of the hydraulic fracturing workflow 622, for example, to assist with performance of a stimulation process, whether for a stage, a subsequent stage, etc. As mentioned, as hydraulic fracturing is performed, additional microseismic energy may be measured, which can be utilized to further refine location estimations, which may be determined via a model and/or be utilized in a model. As shown in FIG. 6, the method 600 can include outputting a production forecast 660, which may be for one or more wells in a region of a field.

As shown in FIG. 6, a model may be utilized for simulations whether for purposes of estimating stimulated rock volume (SRV) and/or for purposes of estimating production. As explained, a simulator can utilize equations discretized using a grid where the grid can be a spatial grid, in one or more dimensions. As fractures tend to have dimensions that are relatively small compared to a dimension or dimensions of a coarse grid that represents a region of a reservoir, a process known as grid refinement may be employed. Grid refinement can include refining existing grid cells and/or introducing new grid cells where one or more finer dimensions are utilized. For example, consider a coarse grid with 2D dimensions of 25 meters by 25 meters in x and y directions, where a z direction represents depth (e.g., in a Cartesian coordinate system). Such a coarse grid may be refined in particular regions that include one or more fractures such that a refined or fine grid is generated, which may include grid cells with one or more dimensions of the order of 5 meters or less (e.g., consider less than 1 meter, less than 60 cm, less than or equal to about 10 cm). In such an approach, one or more SRV estimations may be utilized to identify a particular region or regions to be refined. As an example, an SRV region, which may be symmetric or asymmetric, can be assigned a permeability that is, in general, greater than the permeability of a reservoir matrix (e.g., reservoir rock) that is not within the SRV region (e.g., beyond the SRV region and further from a fracture). As explained, a fracture may be formed that has wings, where one wing extends in one direction from a well and where another wing extends in an opposing direction from the well. In such an example, a SRV region may be defined, which may be symmetric, which assumes that the wings of the fracture are symmetric.

As explained, a simulator can utilize a grid model where various portions of the grid model are assigned properties, which can include permeability. Hydraulic fracturing can increase permeability of a region, which can improve an ability of producing hydrocarbons from a hydrocarbon reservoir. As explained, grid refinement may be utilized, which can increase accuracy of a grid model as fine grid cells may be able to more accurately model physical phenomena such as pressure gradients, fluid velocity gradients, etc., in a region near a well.

As explained, a SRV may be utilized and defined as a region of limited extension whose permeability is enhanced by one or more hydraulic fractures (HFs). As explained, an accurate SRV model can enhance field development planning and/or operations in unconventional reservoir simulations.

As mentioned, a grid can include a region with one or more fractures where the one or more fractures are modeled explicitly. As an example, a method can provide for grid refinement to more precisely represent SRV geometry, for example, by generating appropriate local grid refinement (LGR) cells. In such an example, a given size of a SRV around one or more HFs can be simulated and the effect on production can be analyzed to determine a suitable development strategy, analyze an operation, control an operation and/or plan a future operation.

As an example, a method can include defining LGR based on SRV width. In such an example, consider a single well where, depending on the relationship between the SRV width and a host global cell size, a boundary of the SRV may align with the host grid line or may terminate between grid lines.

Figure 7:
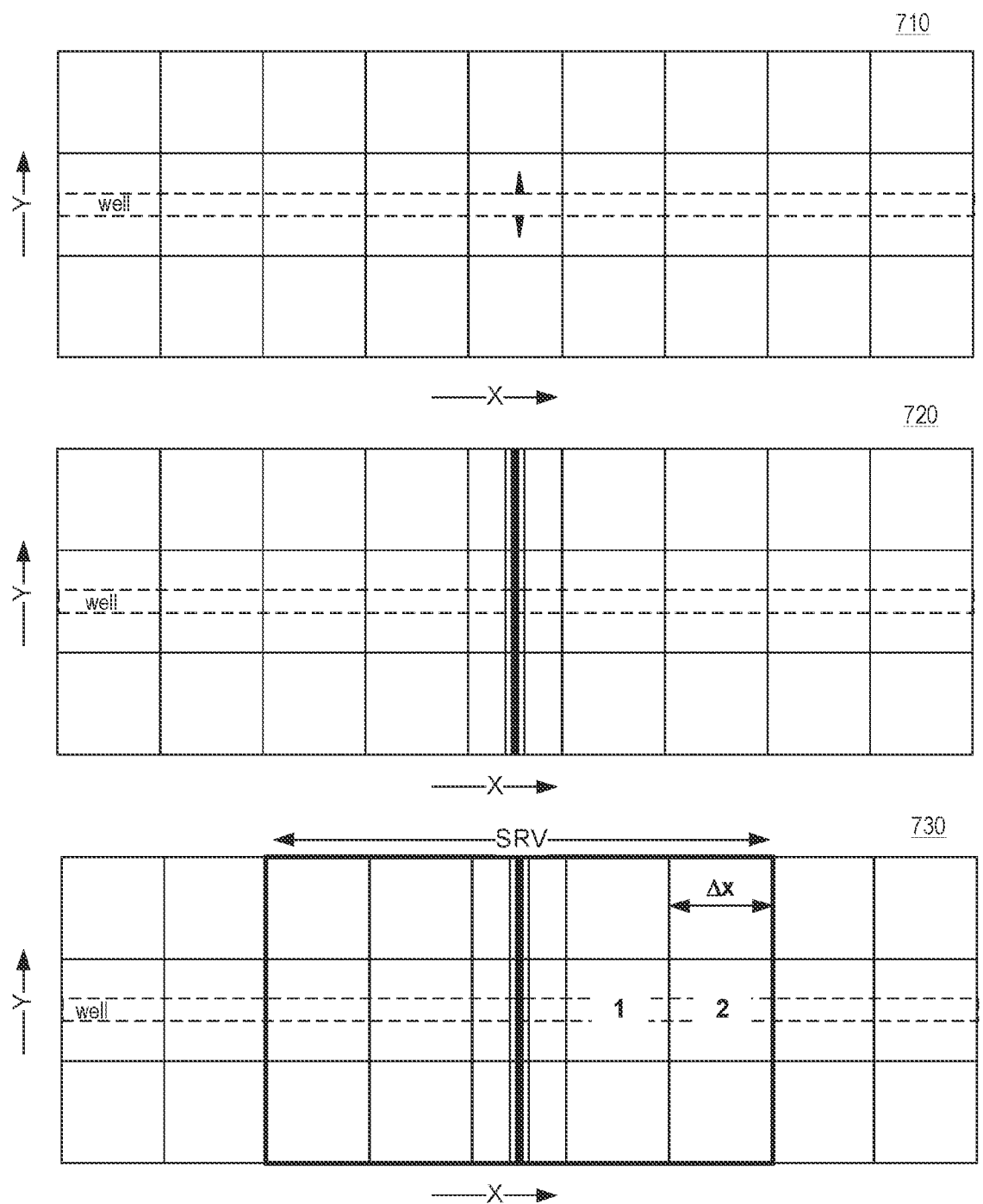
FIG. 7 illustrates examples of grids as plots.

FIG. 7 shows example grids 710, 720, and 730, as viewed from above, that include a well that is utilized to create a hydraulic fracture where the well is substantially normal to a plane defined by the hydraulic fracture (HF). As shown, the well runs along an x dimension and the HF extends along a y dimension, where a z dimension can be a depth. The grid 710 shows the well and points such as perforations where hydraulic fracturing can be utilized to generate the HF that extends along the y dimension as shown in the grids 720 and 730.

As shown in the grid 720, three of the coarse cells can be utilized to represent the HF with two wings, in opposing directions along the y dimension from the well. As explained, an HF can increase permeability in a region beyond that of a reservoir matrix, and an SRV width, as shown in the grid 730, can be utilized to define an SRV region that is to be represented using an estimated permeability value that differs from permeability of the reservoir matrix that is outside of the SRV width. In the example of FIG. 7, a coarse grid cell dimension $\Delta x$ is given and two cells are labeled 1 and 2 (e.g., cell 1 and cell 2), which are, in this example, cells that do not include the HF itself, which is represented by the thick vertical line at the middle of the SRV.

In the example of FIG. 7, the SRV region, represented by a thick-lined box, aligns with the boundaries of the grid cells such that a clear distinction exists as to what permeability values and/or one or more other properties are to be assigned to the cells of the grid. Again, FIG. 7 shows a single HF with its SRV where an area within a frame is the SRV while also showing a couple of vertical grid lines of the HF local grid refinement (LGR) (e.g., for the HF itself as intersecting the three cells) and global cells.

As an example, a method can utilize one or more criteria to determine if an SRV boundary aligns with a host grid line. For example, consider max{2 ft, 5% of $\Delta x$}, where 2 ft and 5% may be adjustable. In such an approach, if the distance between the SRV's boundary and the closest grid line is less than max{2 ft, 5% of $\Delta x$}, the SRV can be treated as if it fully covers those host cells.

Figure 8:
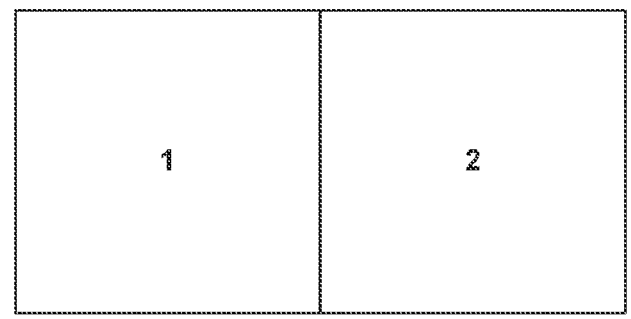
FIG. 8 illustrates examples of grids as plots.
Figure 8:
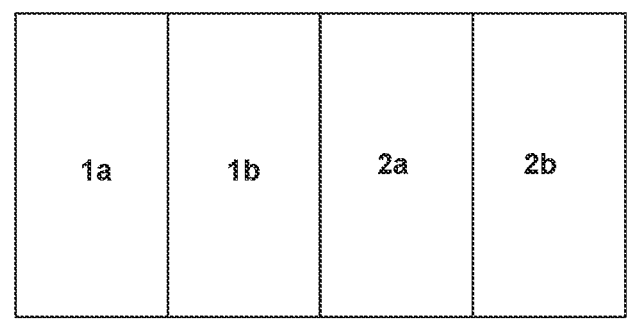
Figure 8:
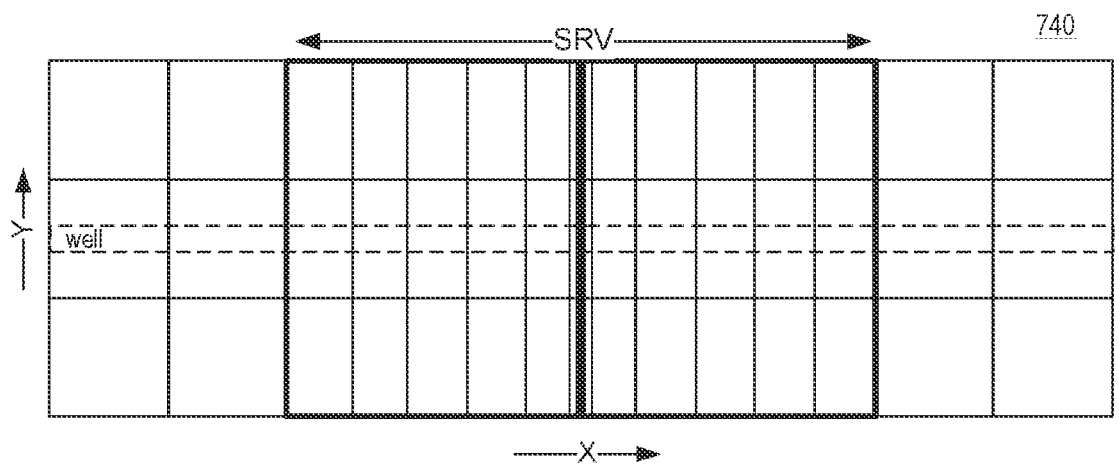

FIG. 8 shows an example progression for cells 1 and 2 as being refined into cells 1a and 1b and cells 2a and 2b, which can be utilized for LGR of the SRV. For example, each host global cell can be divided by 2 in the x direction to form 2 LGR cells. In such an example, permeability of the LGR cells, except for the fracture cell, can be modified by an SRV permeability multiplier.

Figure 9:
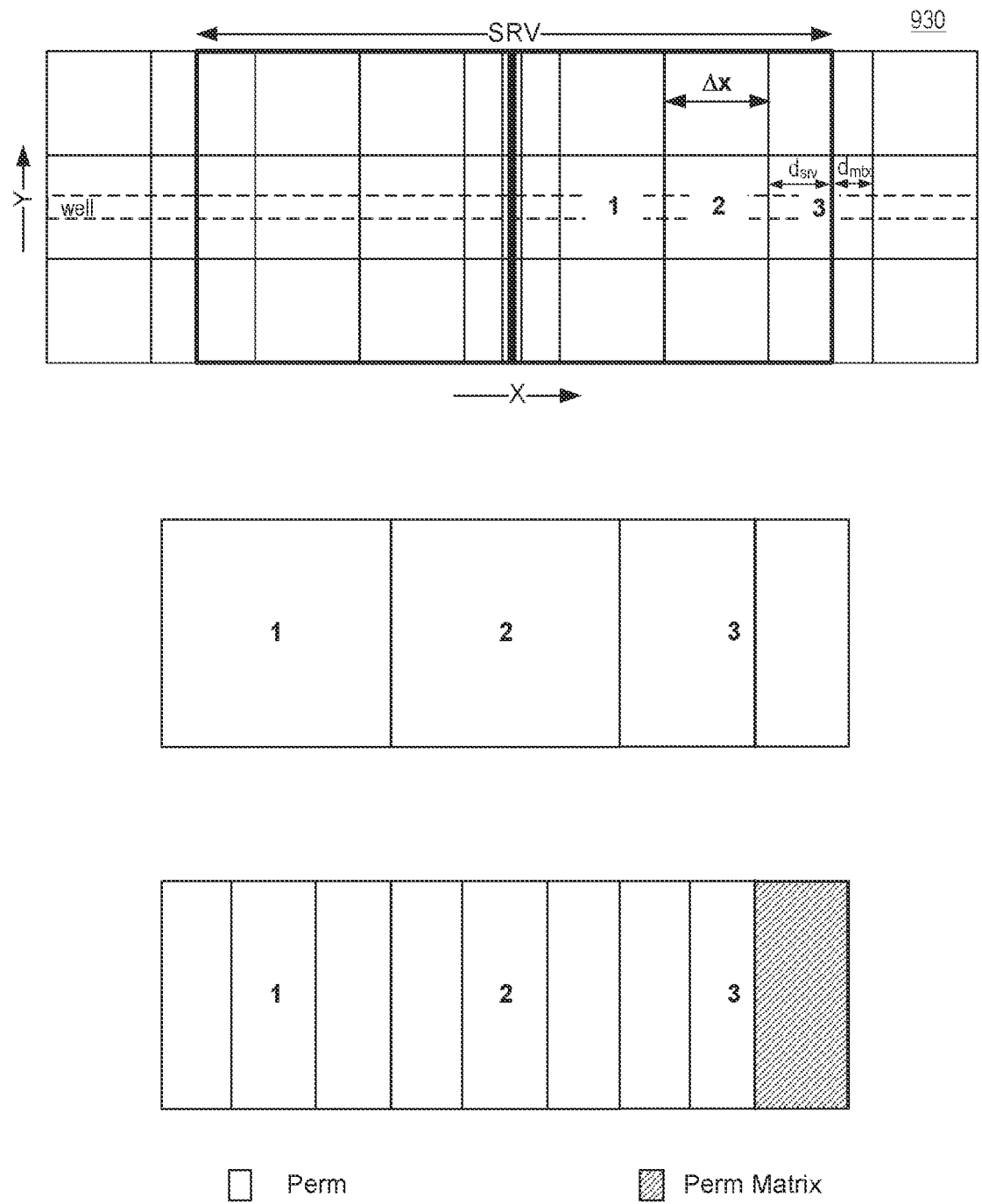
FIG. 9 illustrates examples of grids as plots.

FIG. 9 shows another example via a plot 930 where the SRV boundary does not align with a coarse cell line. In such a scenario, if the SRV's width extends into the (i+1)th host cell (cell 3) by less than max{2 ft, 5% of $\Delta x$}, the coverage in that host cell may be ignored. For example, the number of LGR cells and their permeability can be determined as if only i host cells are fully covered by the SRV. However, as shown in the plot 930, the one or more criteria are not met such that a method can be implemented that takes into account that an SRV boundary terminates between grid lines.

In the example plot 930 of FIG. 9, the number of local grid cells can be determined by:
 Locating the edge global cell, which is the last cell that has a portion of the SRV (cell 3);
 Determine the distance influenced by SRV, $d_{srv}$;
 Calculate the distance of matrix rock $d_{mtx} = \Delta x - d_{srv}$;
 Compare $d_{srv}$ and $d_{mtx}$
 If min{$d_{srv}$, $d_{mtx}$} > max{2 ft, 5% of $\Delta x$}, $\Delta x_{LGR}$ = min{$d_{srv}$, $d_{mtx}$}
 Else $\Delta x_{LGR}$ = max{2 ft, 5% of $\Delta x$}; and
 The number of LGR cells $N_{LGR}$ = round($\Delta x / \Delta x_{LGR}$ − 0.5)

As an example, the geometry of local grid cells can be determined as follows:
 1. The boundary (line of cell 3) between SRV and matrix can be honored (one LGR cell size is $\Delta x_{LGR}$); and
 2. The rest of host cell is then divided uniformly by ($N_{LGR}$ − 1) (those LGR cell size $\Delta x^*_{LGR} = (\Delta x - \Delta x_{LGR})/(N_{LGR} - 1)$).

As an example, the permeability of local grid cells can be defined by:
 Permeability of the LGR cells within the SRV width, except for the fracture cell, is modified by the SRV permeability multiplier; and
 For the LGR cells beyond of SRV width, their permeability is kept the same as matrix permeability.

Figure 10:
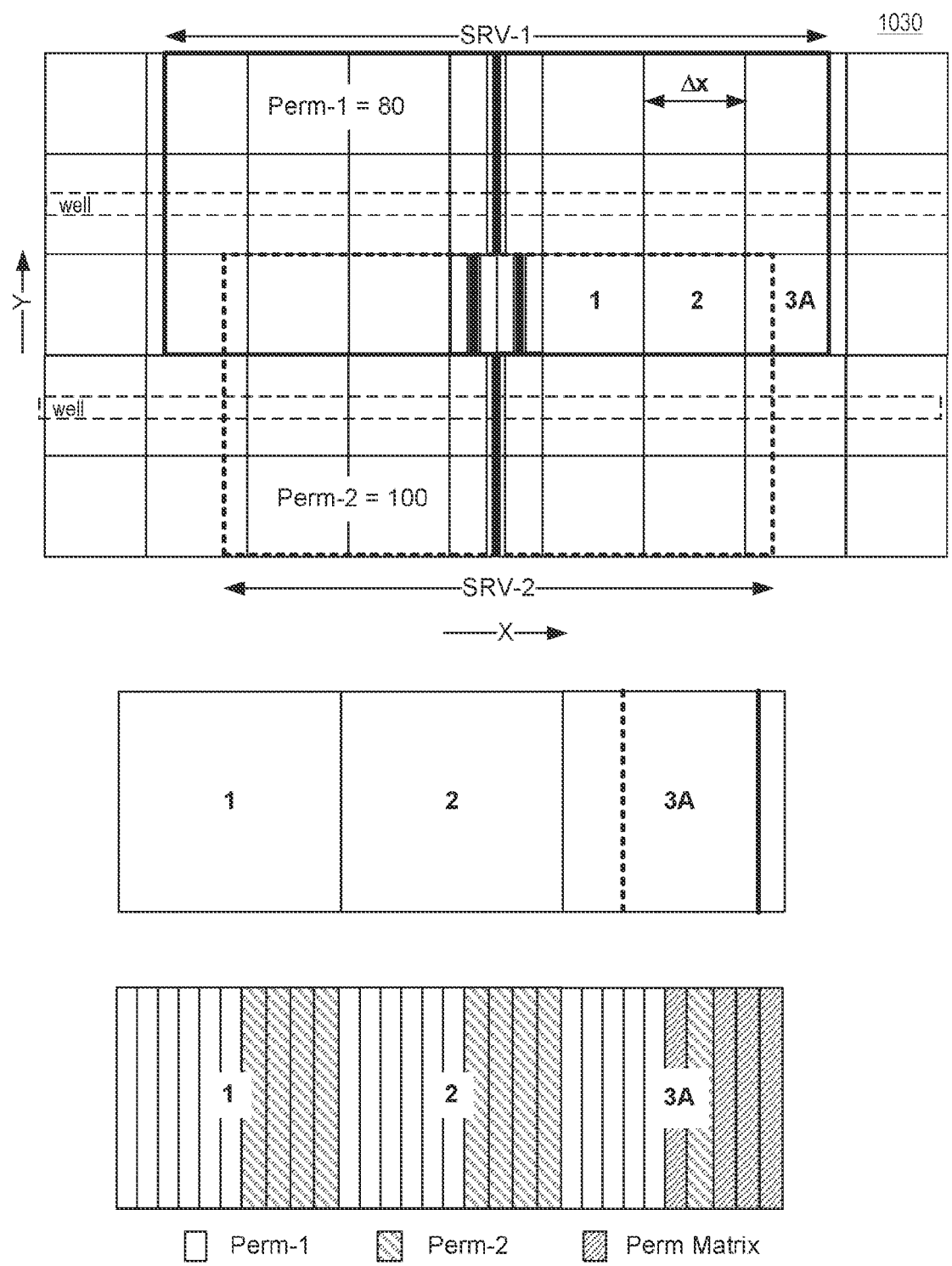
FIG. 10 illustrates examples of grids as plots.

FIG. 10 shows an example plot 1030 for a scenario where two wells exist and the SRVs, SRV-1 and SRV-2, for the two wells overlap. Hence, with multiple wells, SRVs may overlap each other. In such instances, as an example, a method can include:
 Assuming N SRVs penetrate the same cell;
 Divide the global cell into N equal parts;
 1st part of global cell has n1 number of LGR cells, where n1 is determined by SRV-1, and permeability in SRV-1 LGR cells are modified by a multiplier defined in SRV-1;
 2nd part of global cell has n2 number of LGR cells, where n2 is determined by SRV-2, and permeability in SRV-2 LGR cells are modified by a multiplier defined in SRV-2;
 . . . .

In the example of FIG. 10, in the top-view plot 1030, SRV-1 and SRV-2 overlap and both their boundaries terminate in the same host cell (cell 3A). As shown, permeability values (e.g., determined via multiplier, etc.) include Perm-1 of 80 and Perm-2 of 100 (e.g., consider permeability values that are normalized, in millidarcies (mD), etc.). In the example of FIG. 10, three permeability values may be utilized Perm-1, Perm-2 and Perm Matrix. In such an approach, a technique may proceed without having to compute or estimate a numerical combined permeability value. For example, through LGR, refined cells (e.g., new cells) can each be assigned one of the three values where a simulator may perform whatever averaging, estimating, etc., as appropriate to account for physical differences in permeability in the various regions of a grid.

As shown in FIG. 10, a host cell can be divided into two parts to represent different SRV geometry and properties. As shown, the cell 3A can be refined into new cells (fine cells) where each of the new cells can be assigned a particular property or set of properties as selected from a group of three sets of properties (e.g., three permeabilities, etc.). As shown in FIG. 10, the cell 3A is refined with 5 new cells that are assigned Perm-1, 1 new cell that is assigned Perm-2 and 4 new cells that are assigned Perm Matrix. In such an approach, a method or a user does not have to be concerned with how the particular refined cells are assigned as long as a representative number are assigned to two or more of the permeabilities (e.g., sets of properties). As a simulator that utilizes a numerical technique can integrate over a volume as may be represented by the coarse cell 3A, the contributions of the fine cells within that volume may be generally in any particular order. As shown, the cell 3A, as refined, includes suitable contributions as to permeability from SRV-1, SRV-2 and the matrix. When a simulator is run, those contributions will contribute to a solution, for example, as to flow toward the wells.

Figure 11:
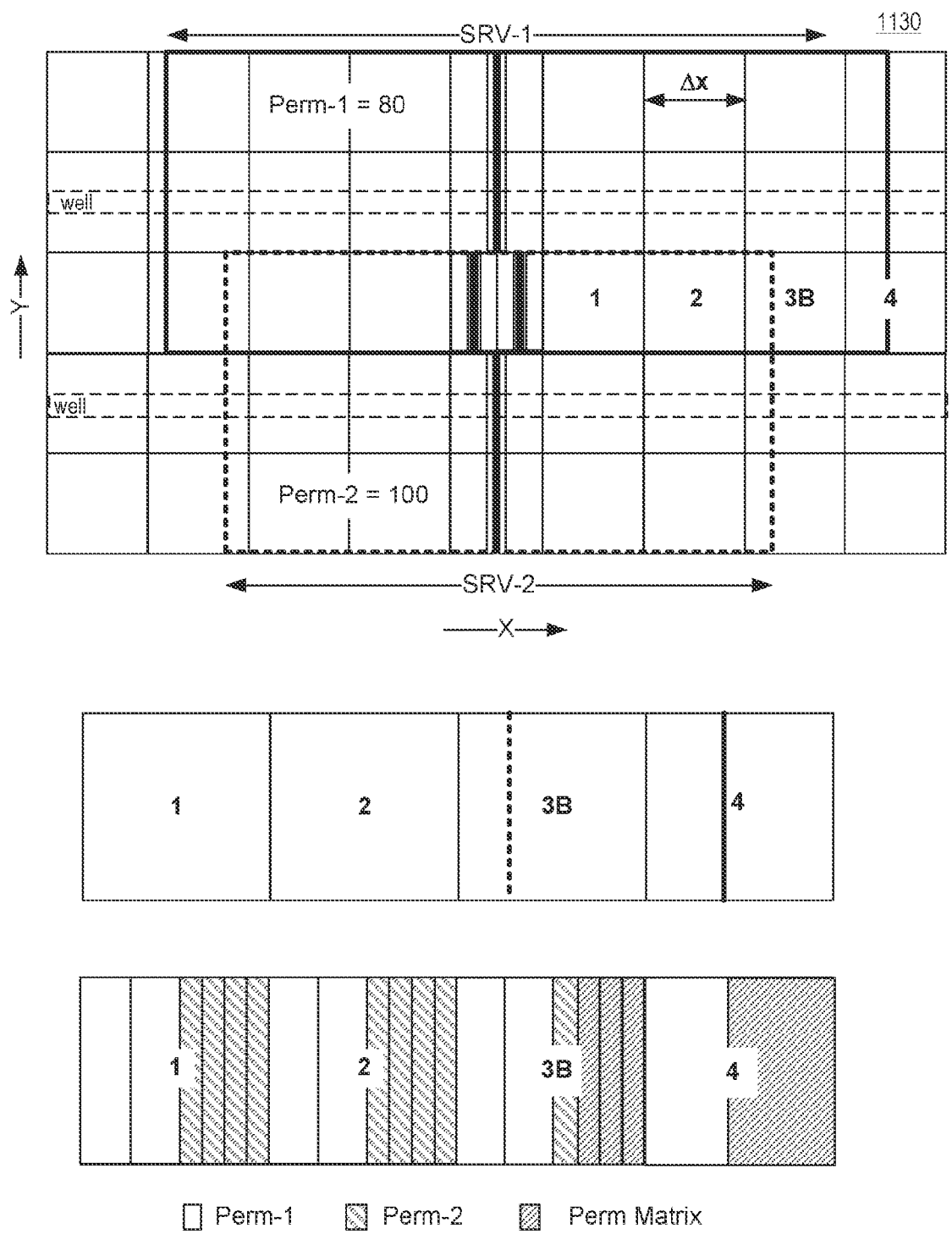
FIG. 11 illustrates examples of grids as plots.

FIG. 11 shows another example scenario in an example plot 1130 where a host cell 3B has an SRV-2 boundary, while SRV-1 fully covers host cell 3B. In such an example, the local grid refinement (LGR) cell geometry and properties can be set to reflect the overlapped SRVs and their permeability multiplier values. As shown, the cell 4 can include refined cells (new cells), one for Perm-1 and one for Perm Matrix and the cell 3B can include refined cells (new cells), two for Perm-1, one for Perm-2, and three for Perm Matrix.

Figure 12:
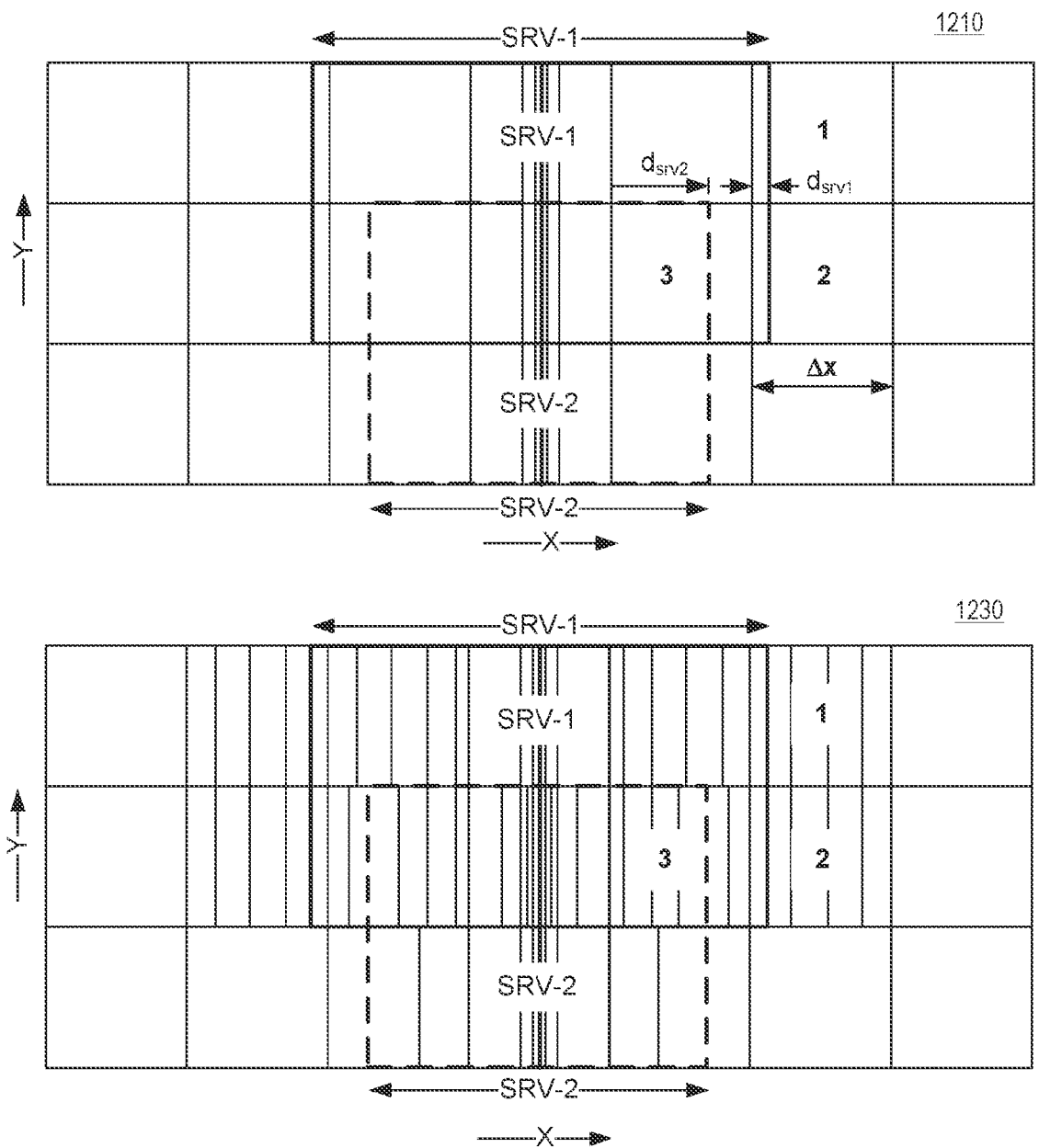
FIG. 12 illustrates examples of grids as plots.

FIG. 12 shows an example scenario in plots 1210 and 1230 for a method that includes local grid refinement (LGR) based on an SRV dimension (e.g., width) and where one or more permeabilities can be assigned within an SRV region, which can be or include an overlapped region of more than one SRV, for example, consider an overlapped region for SRV-1 and SRV-2.

In the example of FIG. 12, the dimension of LGR cells can be determined using a technique, which may be referred to as a division technique or refinement technique. Such a technique can help to ensure that the size change between adjacent cells does not exceed a criterion such as a maxFactor criterion (e.g., consider a value hard coded as 2). Such a criterion can relate to simulation as performed by a simulator, for example, to maintain dynamic simulation stability, which, in turn, can provide more accurate simulation results (e.g., in lesser time, with increased assurance of convergence, etc.).

In the example of FIG. 12, a first SRV has an x-coordinate dimension labeled accordingly as SRV-1 and, a second SRV has an x-coordinate dimension labeled accordingly as SRV-2, which may be equal to or not equal to the x-coordinate dimension of SRV-1. As shown, where SRV-1 and SRV-2 partially overlap and where the dimensions are centered on the HF and differ, then one or more cells can exist between an outer boundary of one of the SRVs and an inner boundary of another one of the SRVs. For example, a portion of a cell labeled cell 3 and a portion of a cell labeled cell 2 exist between an outer boundary of SRV-2 and an inner boundary of SRV-1 where, for example, dimensions $d_{srv1}$ (e.g., for cell 2) and $d_{srv2}$ (e.g., for cell 3) can be defined.

As an example, a method can include determining a number of SRV division borders inside a global cell and determining a number of LGR cells and their size(s). As to the number of SRV divisions, if none of SRVs overlap on a global cell, the number of SRV division borders is 1; whereas, if there are overlapped SRVs, the number of SRV division borders is equal to the number of overlapped SRVs. For example, with reference to the plot 1210, cell 1 and cell 2 have one SRV division border from SRV-1 and cell 3 has two SRV division borders from SRV-1 and SRV-2.

Once the SRV division borders are determined, a host global cell can be normalized with length of unity (e.g., a value of 1). And, the relative location of SRV division borders to the grid boundary can be computed and sorted in an ascending order between 0 and 1 (e.g., two cell boundaries). In the plot 1210, the division border of SRV-1 is located at 0.1 relative to the left grid boundary in cell 1 and cell 2 (see, e.g., $d_{srv1}$), where the division border of SRV-2 is approximately 0.7 in cell 3 (see, e.g., $d_{srv2}$). Therefore, in cell 1 and cell 2, the array of division borders is [0, 0.1, 1]; and in cell 3, the array of division borders is [0, 0.1, 0.7, 1]. As to the division size, it is the distance between two borders: in cell 1 and cell 2, the array of division sizes is [0.1, 0.9]; and in cell 3, the array of division sizes is [0.1, 0.6, 0.3].

As an example, a division technique (e.g., a refinement technique) can utilize division sizes and the maxFactor criterion (e.g., parameter) as input and iteratively compute the geometry of refined cells. For example, with the example of division sizes in cell 3 ([0.1, 0.6, 0.3]), the loop of the division technique can be set forth as follows:

1. Identify the maximum division size (e.g., 0.6); its previous (e.g., 0.1) and its next (e.g., 0.3);
2. Compute the half of the maximum division size (HMD) (e.g., 0.6/2=0.3);
3. Compute the difference to the previous size (DP) and difference to the next size (DN) using the following definitions:

$$DP = \text{max. division size} - prev*\text{max Factor} \; (\text{e.g., } DP = 0.6-0.1*2 = 0.4)$$

$$DN = \text{max. division size} - next*\text{max Factor} \; (\text{e.g., } DN = 0.6-0.3*2 = 0)$$

4. If DP is higher than HMD (e.g., 0.4>0.3), then,
    the max. division size is split into two values (e.g., prev*maxFactor, max. division size–prev*maxFactor)
5. Else, if the DN is higher than HMD then,
    the max. division size is split into two values (e.g., size–next*maxFactor, next*maxFactor)
6. Else,
    the max. division size is split into two values (HMD, HMD)
7. Repeat step 1 to 6, until:
    a. All ratios of adjacent division size are less than maxFactor; or
    b. The number of division sizes is >=20, then the global cell is split into 20 uniform LGR cells; noting that the value of 20 can be an automatically determined value, a default value, a user adjustable value, etc.

Given the geometry of the SRVs in the plot 1210, the division sizes (e.g., refinement sizes) for the LGRs in cell 1, cell 2, and cell 3 can be determined as set forth in Table 1, below.

TABLE 1

Example Values for Division Sizes

| Loop | Cell 1 and Cell 2 | Cell 3 |
| --- | --- | --- |
| 1 | [0.1, 0.9] | [0.1, 0.6, 0.3] |
| 2 | [0.1, 0.2, 0.7] | [0.1, 0.2, 0.4, 0.3] |
| 3 | [0.1, 0.2, 0.5, 0.2] | [0.1, 0.2, 0.2, 0.2, 0.3] |
| 4 | [0.1, 0.2, 0.25, 0.25, 0.2] | [0.1, 0.2, 0.2, 0.2, 0.15, 0.15] |

In the example of FIG. 12, the plot 1230 shows LGRs that correspond to the division size values of Table 1, above, as determined through use of an example method (e.g., an example refinement technique).

As an example, after determination of dimension(s) of LGR cells, one or more SRV permeability values can be assigned to the LGR cells that are located within an SRV width using one or more existing permeability values. As an example, permeability in an overlapped region of multiple SRVs can be computed using one or more approaches. For example, consider computing the permeability in the overlapped region of SRV-1 and SRV-2 in the example of FIG. 12 using the harmonic mean (HM) of individual SRV permeabilities (e.g., existing permeability values). In such an example, consider the permeability in SRV-1 to be 0.5 mD, while the permeability in SRV-2 is 10 mD, such that the permeability in the overlapped region is 0.95 mD, which is the HM of 0.5 and 10. In contrast, if the average mean (AM) was utilized, the resulting permeability would be equal to 0.5×(0.5 mD+10 mD)=5.25 mD, which is substantially greater than the 0.95 mD permeability resulting from use of HM.

The harmonic mean (HM) is one of several kinds of averages, and in particular, one of the Pythagorean means, where the Pythagorean means include the arithmetic mean (AM), the geometric mean (GM), and the harmonic mean (HM). For positive data sets containing at least one pair of nonequal values, the HM provides a value that is the least of the three means (AM, GM and HM), while the AM provides a value that is the greatest of the three and the GM provides a value that is between that of the HM and the AM. As an example, use of the HM can help to assure that a property value such as, for example, permeability, is not too high for a refined grid cell as generated using a LGR technique. For example, if a permeability value is too high, that value may possibly result in simulation results that indicate fluid flow that is higher than reality. Hence, use of HM, or GM, may help to reduce risk of overestimating fluid flow in an overlapping region of multiple SRVs compared to a computational technique that provides a value that is higher than that of HM or GM. Where a conservative simulation is desired for overlapping SRVs with different property values, an AM technique may be excluded. In various trial simulations, use of an HM technique provided acceptably accurate simulation results.

As an example, an assignment process can utilize one or more existing property values, which can be one or more existing permeability values. In such an example, the assignment process may utilize one or more of the existing property values for one or more cells without computation and may utilize one or more of the existing property values with computation to arrive at a new property value, which may be, for example, a Pythagorean mean value. As to the HM, it can be expressed as the reciprocal of the AM of the reciprocals of a given set of observations (e.g., values). For example, the harmonic mean of 1, 4, and 4 can be expressed as follows:

$$\left(\frac{1^{-1} + 4^{-1} + 4^{-1}}{3}\right)^{-1} = \frac{3}{\frac{1}{1} + \frac{1}{4} + \frac{1}{4}} = \frac{3}{1.5} = 2$$

In the foregoing example that applies an HM technique, three values are utilized, which may correspond to three property values of three different SRVs where the three SRVs at least partially overlap (e.g., three overlapping SRVs). For example, a first SRV can have a property value of 1, a second SRV can have a property value of 4, and a third SRV can have a property value of 4, where the HM can be computed to provide a property value of 2 that can be assigned to the overlapping region of the first, second, and third SRVs. In various examples, two or more SRVs may overlap, where, for example, an overlapped region may be overlapped by two or more SRVs.

As explained, the one or more approaches of the examples of FIG. 7 to FIG. 12 can be part of a group of approaches that can be selected according to logical rules that may implement one or more criteria, which may be adjustable as to scale, dimension, etc. Such an approach can expeditiously facilitate grid refinement and assignment of properties for purposes of executing a simulator where number of refined grid cells and property assignments can occur automatically and in a manner that is suitable for improving accuracy of a simulator to thereby improve simulation results. As explained, in various examples, a method does not necessarily have to honor proximity or order within a refined coarse cell as to new fine cells because a simulator can perform integration over a volume where through such integration the contributions to permeability are appropriately taken into account. Note that in various examples with "mixed" coarse cells, neither a user nor a method may have to compute a "new" permeability (e.g., permeability multiplier value); rather, the existing permeabilities may be assigned to various new finer cells within a coarse cell, which now becomes a so-called "mixed" coarse cell.

As an example, a method can handle scenarios where two or more SRVs overlap for a well such that modification of global host cells permeability within a region can covers the fractures along that well. As an example, permeability for fracture LGR cells (LGR cells that represent a HF itself) can be assign by fracture permeability; while the rest of LGR cells influenced by an SRV can have permeability multiplied by a corresponding SRV permeability multiplier. As explained, a model can be a grid model where a well and at least one HF exists with a corresponding SRV bordered by a reservoir matrix. In such an approach, a permeability can be assigned to grid cells that model an HF, a permeability can be assigned to grid cells that model an SRV, and a permeability can be assigned to grid cells that model the reservoir matrix, noting that some coarse cells can be refined such that within a coarse cell, the refined cells can include cells that can be assigned one or more permeabilities (e.g., using one or more SRV permeabilities and/or a reservoir matrix permeability).

Referring again to the method 600 of FIG. 6, as updates may occur to an SRV workflow and/or a hydraulic fracturing workflow, one or more SRVs may be updated, one or more HFs may be introduced (e.g., or altered), one or more wells may be drilled, etc. As an example, one or more SRV related LGR techniques may be implemented in a dynamic manner to improve accuracy of simulation, which may occur automatically based on one or more updated SRV dimensions and/or SRV properties. As explained, an improved production forecast may be generated using a simulation and/or one or more improvements may be made to one or more hydraulic fracturing workflows (e.g., planning, execution, etc.). An improved production forecast may be utilized for planning, execution, etc., of one or more stimulation treatment processes, which can include, for example, hydraulic fracturing and/or one or more other types of treatments.

Figure 13:
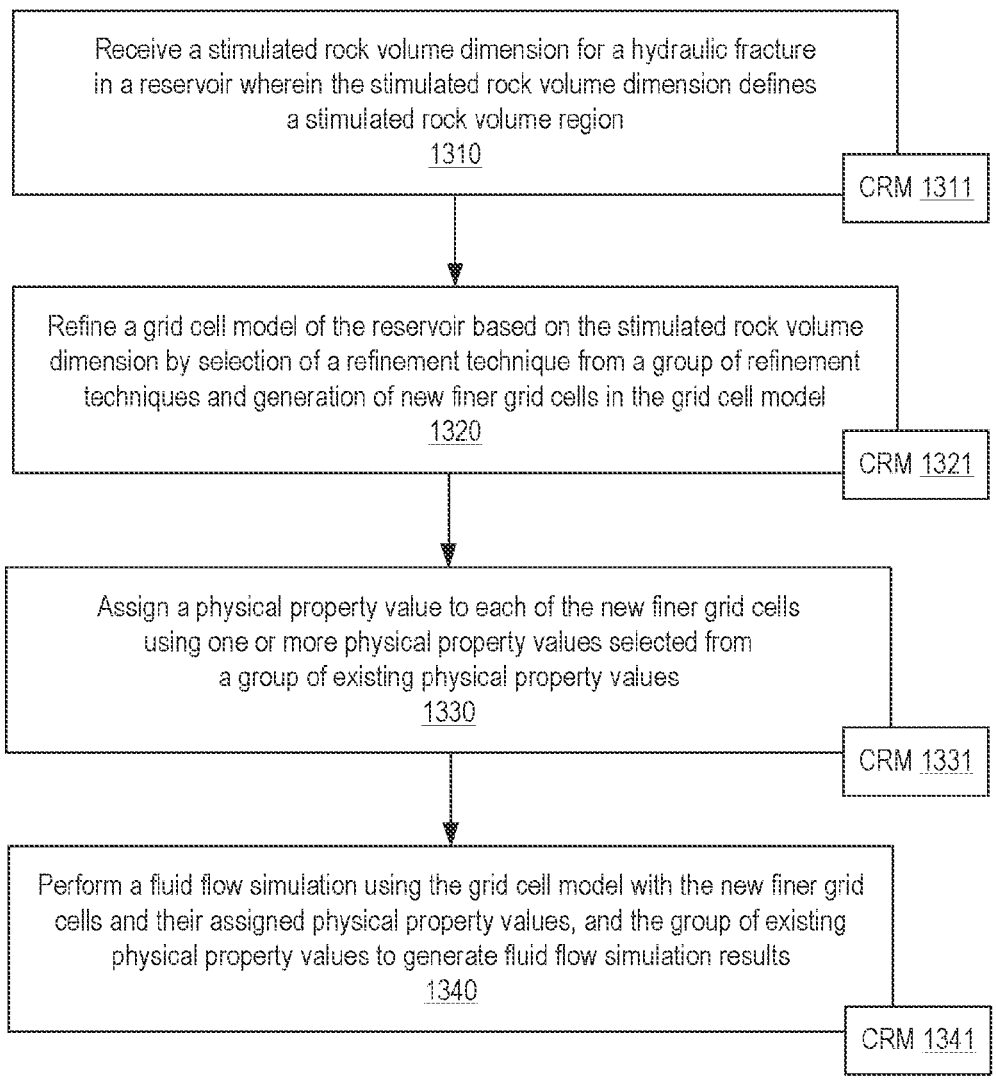
FIG. 13 illustrates an example of a method and an example of a system.
Figure 13:
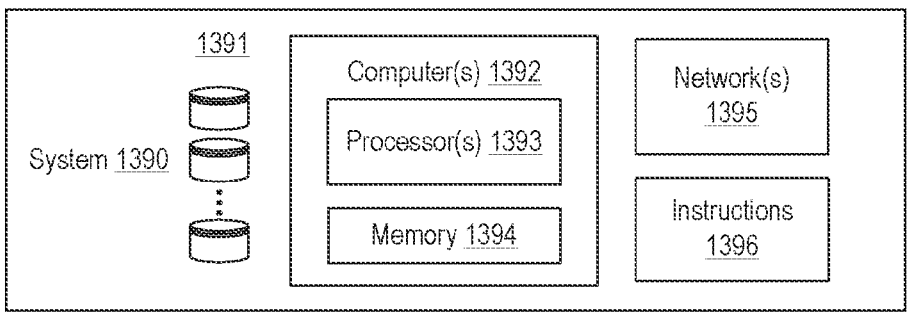

FIG. 13 shows an example of a method 1300 that includes reception block 1310 for receiving a stimulated rock volume dimension for a hydraulic fracture in a reservoir where the stimulated rock volume dimension defines a stimulated rock volume region; a refinement block 1320 for refining a grid cell model of the reservoir based on the stimulated rock volume dimension by selecting a refinement technique from a group of refinement techniques and generating new finer grid cells in the grid cell model based on the selected refinement technique; an assignment block 1330 for assigning a physical property value to each of the new finer grid cells using one or more physical property values selected from a group of existing physical property values; and a performance block 1340 for performing a fluid flow simulation using the grid cell model with the new finer grid cells and their assigned physical property values, and the group of existing physical property values to generate fluid flow simulation results.

In the example of FIG. 13, a system 1390 includes one or more information storage devices 1391, one or more computers 1392, one or more networks 1395 and instructions 1396. As to the one or more computers 1392, each computer may include one or more processors (e.g., or processing cores) 1393 and a memory 1394 for storing the instructions 1396, for example, executable by at least one of the one or more processors. As an example, a computer may include one or more network interfaces (e.g., wired or wireless), one or more graphics cards, a display interface (e.g., wired or wireless), etc.

The method 1300 is shown along with various computer-readable media blocks 1311, 1321, 1331, and 1341 (e.g., CRM blocks). Such blocks may be utilized to perform one or more actions of the method 1300. For example, consider the system 1390 of FIG. 13 and the instructions 1396, which may include instructions of one or more of the CRM blocks 1311, 1321, 1331, and 1341.

As an example, a method can include receiving a stimulated rock volume dimension for a hydraulic fracture in a reservoir where the stimulated rock volume dimension defines a stimulated rock volume region; refining a grid cell model of the reservoir based on the stimulated rock volume dimension by selecting a refinement technique from a group of refinement techniques and generating new finer grid cells in the grid cell model based on the selected refinement technique; assigning a physical property value to each of the new finer grid cells by selecting the physical property value from a group of existing physical property values; and performing a fluid flow simulation using the grid cell model with the new finer grid cells and the group of existing physical properties to generate fluid flow simulation results. In such an example, the selecting a refinement technique can include comparing a position of a grid cell line to a position of a boundary of the stimulated rock volume region. For example, if the boundary and the grid cell line do not align, a method can include determining a distance between the boundary and the grid cell line, and comparing the distance to a pre-defined distance criterion; and/or if the boundary and the grid cell line do not align, a method can include identifying a grid cell as including the boundary, and comparing a percentage of the grid cell that is within the stimulated rock volume region to a pre-defined percentage criterion.

As an example, refining can account for another stimulated rock volume region that overlaps the stimulated rock volume region and, for example, assigning can account for the overlap of the stimulated rock volume regions (e.g., where each of the stimulated rock volume regions may correspond to a different well.

As an example, a stimulated rock volume dimension can be determined via microseismic sensing during creation of the hydraulic fracture and/or via sampling of one or more properties of the reservoir.

As an example, a method can include planning a hydraulic fracturing operation based at least in part on fluid flow simulation results and/or controlling a hydraulic fracturing operation based at least in part on the fluid flow simulation results.

As an example, a method can include updating a stimulated rock volume dimension based at least in part on fluid flow simulation results. For example, such updating may be performed during one or more hydraulic fracturing operations. In such an example, data acquired during an operation can be utilized and, for example, the operation may be controlled (e.g., to generate desired fractures in one or more stages, etc.).

As an example, a method can include refining and assigning that are performed automatically responsive to receipt of a stimulated rock volume dimension or stimulated rock volume dimensions for one or more stimulated rock volumes.

As an example, refining and assigning can improve operation of a computational simulator utilized for performing simulation. For example, iterative convergence can be improved and/or accuracy of simulation results. As to iterative convergence, refining and assigning can help to provide for smoother gradients of values of physical properties and/or physical phenomena (e.g., flow, pressure, etc.), which can result in less error during a simulation run, which, in turn, can help to improve iterative convergence to an acceptably accurate solution (e.g., simulation results). As explained, appropriate refinement and assignment may help to assure convergence to a solution; whereas, without such refinement and assignment, a computational simulator may experience issues that prevent convergence to a solution or that result in convergence to an unacceptable, inaccurate solution.

As an example, a method can include assigning a physical property value to each of a number of new finer grid cells in a manner that does not compute the physical property value for any of the new finer grid cells based on two or more of a group of existing physical property values. As explained, permeability or permeability multipliers may be provided for different regions where a refined grid cell can include new grid cells where each of the new grid cells can be assigned one or more of such values.

As an example, a method can include assigning a physical property value to new finer grid cells, where, for example, for an overlapping region of two or more stimulated rock volume regions, the assigning a physical property value can include assigning a physical property value to each of the new finer grid cells in the overlapping region at least in part by computing a Pythagorean mean based on two or more of a group of existing physical property values. In such an example, the harmonic mean may be utilized. As explained, an overlapping region may be an overlap of two different stimulated rock volume regions or more than two different stimulated rock volume regions.

As an example, a grid cell model can include grid cells with a dimension orthogonal to a hydraulic fracture that is greater than 10 meters where new finer grid cells include a dimension orthogonal to the hydraulic fracture that is less than 10 meters.

As an example, a method can include, for a boundary of a stimulated rock volume that does not align with a grid line of the grid cell model, determining a distance of a grid cell within the stimulated rock volume, $d_{srv}$, determining a distance of the grid cell outside of the stimulated rock volume, $d_{mtx}$, and determining a number of the new finer grid cells within the grid cell according to:

If $\min\{d_{srv}, d_{mtx}\} > \max\{2 \text{ ft}, 5\% \text{ of } \Delta x\}$, $\Delta x_{LGR} = \min\{d_{srv}, d_{mtx}\}$;

Else $\Delta x_{LGR} = \max\{2 \text{ ft}, 5\% \text{ of } \Delta x\}$; and

Where the number of the new finer grid cells=round($\Delta x / \Delta x_{LGR} - 0.5$), wherein $\Delta x$ is a dimension of the grid cell.

As an example, a system can include a processor; a memory accessible to the processor; processor-executable instructions stored in the memory and executable to instruct the system to: receive a stimulated rock volume dimension for a hydraulic fracture in a reservoir wherein the stimulated rock volume dimension defines a stimulated rock volume region; refine a grid cell model of the reservoir based on the stimulated rock volume dimension by selection of a refinement technique from a group of refinement techniques and generation of new finer grid cells in the grid cell model based on the selected refinement technique; assign a physical property value to each of the new finer grid cells using one or more physical property values selected from a group of existing physical property values; and perform a fluid flow simulation using the grid cell model with the new finer grid cells and their assigned physical property values, and the group of existing physical property values to generate fluid flow simulation results.

As an example, one or more non-transitory computer-readable storage media can include computer-executable instructions executable to instruct a computing system to: receive a stimulated rock volume dimension for a hydraulic fracture in a reservoir wherein the stimulated rock volume dimension defines a stimulated rock volume region; refine a grid cell model of the reservoir based on the stimulated rock volume dimension by selection of a refinement technique from a group of refinement techniques and generation of new finer grid cells in the grid cell model based on the selected refinement technique; assign a physical property value to each of the new finer grid cells using one or more physical property values selected from a group of existing physical property values; and perform a fluid flow simulation using the grid cell model with the new finer grid cells and their assigned physical property values, and the group of existing physical property values to generate fluid flow simulation results.

As an example, a computer program product can include instructions to instruct a computing system to perform one or more methods as described herein.

As an example, a system may include instructions, which may be provided to analyze data, control a process, perform a task, perform a workstep, perform a workflow, etc.

Figure 14:
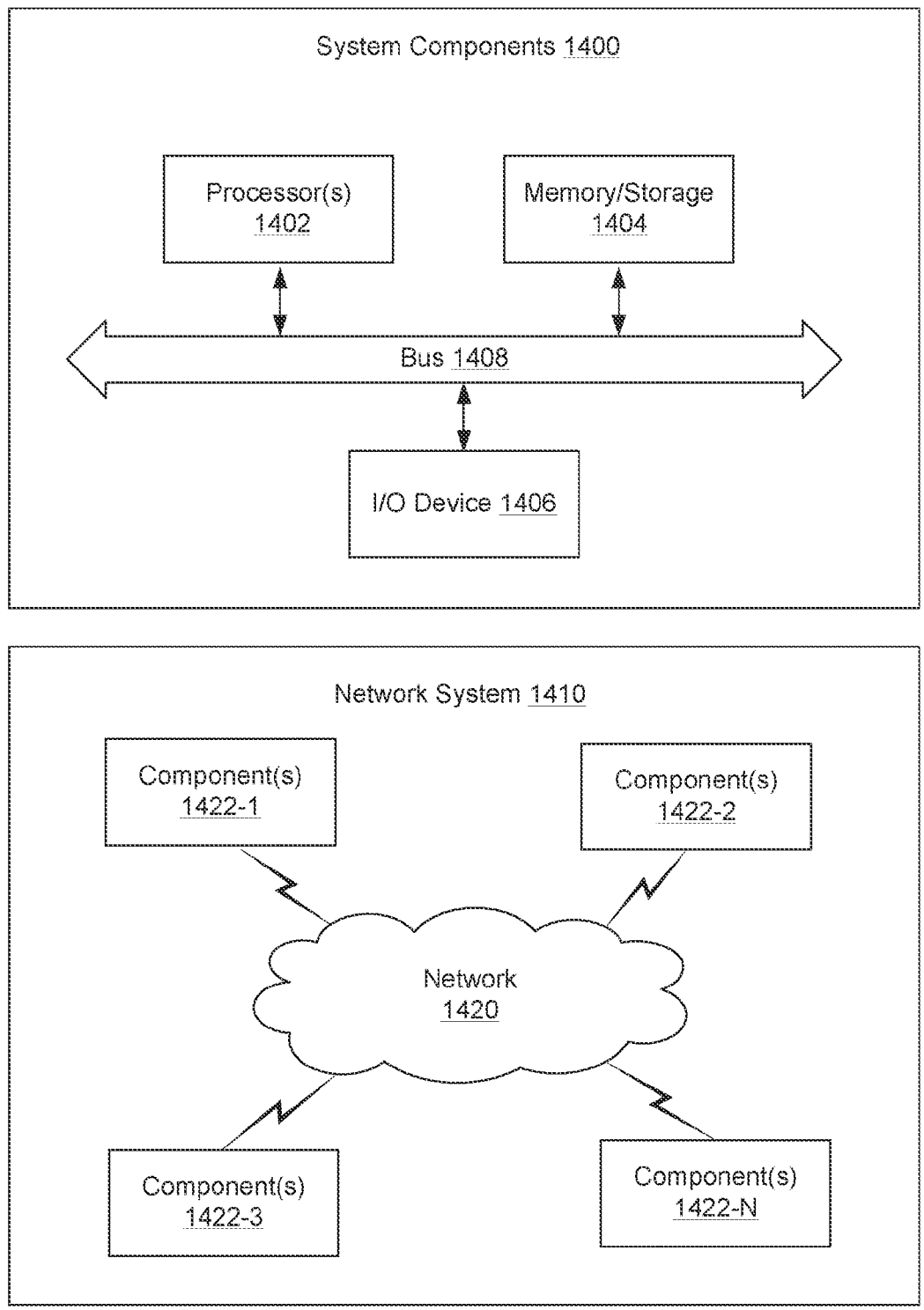
FIG. 14 illustrates example components of a system and a networked system.

FIG. 14 shows components of an example of a computing system 1400 and an example of a networked system 1410 and a network 1420. The system 1400 includes one or more processors 1402, memory and/or storage components 1404, one or more input and/or output devices 1406 and a bus 1408. In an example embodiment, instructions may be stored in one or more computer-readable media (e.g., memory/storage components 1404). Such instructions may be read by one or more processors (e.g., the processor(s) 1402) via a communication bus (e.g., the bus 1408), which may be wired or wireless. The one or more processors may execute such instructions to implement (wholly or in part) one or more attributes (e.g., as part of a method). A user may view output from and interact with a process via an I/O device (e.g., the device 1406). In an example embodiment, a computer-readable medium may be a storage component such as a physical memory storage device, for example, a chip, a chip on a package, a memory card, etc. (e.g., a computer-readable storage medium).

In an example embodiment, components may be distributed, such as in the network system 1410, which includes a network 1420. The network system 1410 includes components 1422-1, 1422-2, 1422-3, . . . 1422-N. For example, the components 1422-1 may include the processor(s) 1402 while the component(s) 1422-3 may include memory accessible by the processor(s) 1402. Further, the component(s) 1422-2 may include an I/O device for display and optionally interaction with a method. The network may be or include the Internet, an intranet, a cellular network, a satellite network, etc.

As an example, a device may be a mobile device that includes one or more network interfaces for communication of information. For example, a mobile device may include a wireless network interface (e.g., operable via IEEE 802.11, ETSI GSM, BLUETOOTH, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few example embodiments have been described in detail above, those skilled in the art will readily appreciate that many modifications are possible in the example embodiments. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A method comprising:
   receiving a stimulated rock volume dimension for a hydraulic fracture in a reservoir, wherein the stimulated rock volume dimension defines a stimulated rock volume region;
   refining a grid cell model of the reservoir based on the stimulated rock volume dimension by:
      selecting a refinement technique from a group of refinement techniques;
      generating new finer grid cells in the grid cell model based on the selected refinement technique; and
      wherein the group of refinement techniques consists of:
         determining a first width of a cell in the grid cell model based on:
            a minimum value between:
               a first distance influenced by a boundary of the stimulated rock volume dimension within the cell; and
               a second distance of matrix rock determined based on the first distance and a width of the cell; and
            a maximum value between:
               a predefined distance, wherein the predefined distance is greater than zero; and
               a third distance associated with a predefined percentage of the width of the cell, wherein the predefined percentage is greater than zero; and
         determining a second width of the cell based on:
            a number of stimulated rock volumes that are present within the cell;
            a plurality of percentage values, wherein each of the plurality of percentage values corresponds to a relative location of a respective one of the number of stimulated rock volumes with respect to the width of the cell; and
            one or more differences between at least one pair of the plurality of percentage values; and
         wherein the new finer grid cells in the grid cell model are generated based on the first width or the second width;
   assigning a physical property value to each of the new finer grid cells using one or more physical property values selected from a group of existing physical property values; and
   performing a fluid flow simulation using the grid cell model with the new finer grid cells and their assigned physical property values, and the group of existing physical property values to generate fluid flow simulation results.

2. The method of claim 1, wherein the refining accounts for another stimulated rock volume region that overlaps the stimulated rock volume region.

3. The method of claim 2, wherein the assigning accounts for the overlap of the stimulated rock volume regions.

4. The method of claim 3, wherein each of the stimulated rock volume regions corresponds to a different well.

5. The method of claim 1, wherein the stimulated rock volume dimension is determined via microseismic sensing during creation of the hydraulic fracture.

6. The method of claim 1, wherein the stimulated rock volume dimension is determined via sampling of one or more properties of the reservoir.

7. The method of claim 1, comprising planning a hydraulic fracturing operation based at least in part on the fluid flow simulation results.

8. The method of claim 1, comprising controlling a hydraulic fracturing operation based at least in part on the fluid flow simulation results.

9. The method of claim 1, comprising updating the stimulated rock volume dimension based at least in part on the fluid flow simulation results.

10. The method of claim 9, wherein the updating is performed during one or more hydraulic fracturing operations.

11. The method of claim 1, wherein the refining and the assigning are performed automatically responsive to receipt of the stimulated rock volume dimension.

12. The method of claim 1, wherein the refining and the assigning improve iterative convergence of a computational simulator utilized for performing the simulation.

13. The method of claim 1, wherein the assigning a physical property value to each of the new finer grid cells does not compute the physical property value for any of the new finer grid cells based on two or more of the group of existing physical property values.

14. The method of claim 1, wherein, for an overlapping region of two or more stimulated rock volume regions, the assigning a physical property value to each of the new finer grid cells in the overlapping region comprises computing a Pythagorean mean based on two or more of the group of existing physical property values.

15. The method of claim 1, the grid cell model comprises grid cells with a dimension orthogonal to the hydraulic fracture that is greater than 10 meters and wherein the new finer grid cells comprise a dimension orthogonal to the hydraulic fracture that is less than 10 meters.

16. A system comprising:
   a processor;
   a memory accessible to the processor;
   processor-executable instructions stored in the memory and executable to instruct the system to:
      receive a stimulated rock volume dimension for a hydraulic fracture in a reservoir wherein the stimulated rock volume dimension defines a stimulated rock volume region;
   refine a grid cell model of the reservoir based on the stimulated rock volume dimension by:
      selection of a refinement technique from a group of refinement techniques;
      generation of new finer grid cells in the grid cell model based on the selected refinement technique; and
      wherein the group of refinement techniques consists of:
         determining a first width of a cell in the grid cell model based on:
            a minimum value between:
               a first distance influenced by a boundary of the stimulated rock volume dimension within the cell; and
               a second distance of matrix rock determined based on the first distance and a width of the cell; and a maximum value between:
  a predefined distance, wherein the predefined distance is greater than zero; and
  a third distance associated with a predefined percentage of the width of the cell, wherein the predefined percentage is greater than zero; and
determining a second width of the cell based on:
  a number of stimulated rock volumes that are present within the cell;
  a plurality of percentage values, wherein each of the plurality of percentage values corresponds to a relative location of a respective one of the number of stimulated rock volumes with respect to the width of the cell; and
  one or more differences between at least one pair of the plurality of percentage values; and
wherein the new finer grid cells in the grid cell model are generated based on the first width or the second width;
assign a physical property value to each of the new finer grid cells using one or more physical property values selected from a group of existing physical property values; and
perform a fluid flow simulation using the grid cell model with the new finer grid cells and their assigned physical property values, and the group of existing physical property values to generate fluid flow simulation results.

17. One or more non-transitory computer-readable storage media comprising computer-executable instructions executable to instruct a computing system to:
  receive a stimulated rock volume dimension for a hydraulic fracture in a reservoir wherein the stimulated rock volume dimension defines a stimulated rock volume region;
  refine a grid cell model of the reservoir based on the stimulated rock volume dimension by:
    selection of a refinement technique from a group of refinement techniques;
    generation of new finer grid cells in the grid cell model based on the selected refinement technique; and
    wherein the group of refinement techniques consists of:
      determining a first width of a cell in the grid cell model based on:
        a minimum value between:
          a first distance influenced by a boundary of the stimulated rock volume dimension within the cell; and
          a second distance of matrix rock determined based on the first distance and a width of the cell; and
        a maximum value between:
          a predefined distance, wherein the predefined distance is greater than zero; and
          a third distance associated with a predefined percentage of the width of the cell, wherein the predefined percentage is greater than zero; and
      determining a second width of the cell based on:
        a number of stimulated rock volumes that are present within the cell;
        a plurality of percentage values, wherein each of the plurality of percentage values corresponds to a relative location of a respective one of the number of stimulated rock volumes with respect to the width of the cell; and
        one or more differences between at least one pair of the plurality of percentage values; and
      wherein the new finer grid cells in the grid cell model are generated based on the first width or the second width;
  assign a physical property value to each of the new finer grid cells using one or more physical property values selected from a group of existing physical property values; and
  perform a fluid flow simulation using the grid cell model with the new finer grid cells and their assigned physical property values, and the group of existing physical property values to generate fluid flow simulation results.

* * * * *